United States Patent
Biercuk et al.

(10) Patent No.: US 11,210,602 B2
(45) Date of Patent: Dec. 28, 2021

(54) MULTI-QUBIT CONTROL

(71) Applicant: Q-Ctrl Pty Ltd, Sydney (AU)

(72) Inventors: Michael Biercuk, NSW (AU); Michael Robert Hush, NSW (AU); Harrison Ball, NSW (AU)

(73) Assignee: Q-Ctrl Pty Ltd, Sydney (AU)

( * ) Notice: Subject to any disclaimer, the term of this patent is extended or adjusted under 35 U.S.C. 154(b) by 0 days.

(21) Appl. No.: 16/754,684

(22) PCT Filed: Jun. 24, 2019

(86) PCT No.: PCT/AU2019/050651
§ 371 (c)(1),
(2) Date: Apr. 8, 2020

(87) PCT Pub. No.: WO2020/019015
PCT Pub. Date: Jan. 30, 2020

(65) Prior Publication Data
US 2021/0256409 A1 Aug. 19, 2021

(30) Foreign Application Priority Data

Jul. 23, 2018 (AU) ................................ 2018902650
Oct. 12, 2018 (AU) ................................ 2018247327

(51) Int. Cl.
*G06N 10/00* (2019.01)
*G06F 15/82* (2006.01)
(52) U.S. Cl.
CPC ............. *G06N 10/00* (2019.01); *G06F 15/82* (2013.01)
(58) Field of Classification Search
CPC ................................. G06N 10/00; G06F 15/82
See application file for complete search history.

(56) References Cited

U.S. PATENT DOCUMENTS 4,899,117 A 2/1990 Vig
5,892,408 A 4/1999 Binder
(Continued)

FOREIGN PATENT DOCUMENTS

AU 2018247327 B1 3/2019
WO WO-2020019015 A1 1/2020

OTHER PUBLICATIONS

"Australian Application No. 2018902650, Australian Patent Office International-Type Search Report dated Sep. 14, 2018", (Sep. 14, 2018), 8 pgs.
(Continued)

*Primary Examiner* — Stacy Whitmore
(74) *Attorney, Agent, or Firm* — Schwegman Lundberg & Woessner, P.A.

(57) ABSTRACT

This disclosure relates to evaluating and improving performance of a control implementation on a quantum processor comprising multiple qubits in the presence of noise. A noise model decomposes noise interactions described by a multi-qubit noise Hamiltonian into multiple contributory noise channels. Each channel generates noise dynamics described by a unique noise-axis operator. For a given control implementation, a unique filter function represents susceptibility of the multi-qubit system to the associated noise dynamics. The filter functions are based on a frequency transformation of the noise axis operator of the corresponding noise channel to thereby evaluate the performance of the control implementation. An optimised control sequence is based on the filter function to reduce the susceptibility of the multi-qubit system to the noise channels, thereby reducing the effective interaction with the multi-qubit noise Hamiltonian. The optimised control sequence controls the quantum processor to thereby improve the performance of the control implementation.

19 Claims, 4 Drawing Sheets

(56) References Cited

U.S. PATENT DOCUMENTS

| | | | |
|---|---|---|---|
| 6,522,212 | B1 | 2/2003 | Kodim |
| 6,587,005 | B2 | 7/2003 | Ichihara |
| 6,710,663 | B1 | 3/2004 | Berquist |
| 7,015,762 | B1 | 3/2006 | Nicholls et al. |
| 7,292,109 | B2 | 11/2007 | Haiut |
| 8,975,970 | B2 | 3/2015 | Sonntag |
| 9,362,929 | B2 | 6/2016 | Sastrawan et al. |
| 2001/0048349 | A1 | 12/2001 | Matsumoto et al. |
| 2005/0093638 | A1 | 5/2005 | Lin et al. |
| 2005/0224784 | A1 | 10/2005 | Amin et al. |
| 2007/0155341 | A1 | 7/2007 | Haiut |
| 2016/0013795 | A1 | 1/2016 | Sastrawan |
| 2016/0292586 | A1 | 10/2016 | Rigetti et al. |
| 2017/0017894 | A1 | 1/2017 | Lanting et al. |

OTHER PUBLICATIONS

"Australian Application No. 2018902650, Response to Australian International-Type Search Report dated Oct. 22, 2018", (Oct. 22, 2018), 3 pgs.

"International Application No. PCT/AU2019/050651, Corrected Version of Written Opinion dated Sep. 3, 2019", (Sep. 3, 2019), 4 pgs.

"U.S. Appl. No. 14/555,927, Non Final Office Action dated Oct. 9, 2015", 21 pgs.

"U.S. Appl. No. 14/555,927, Notice of Allowance dated Mar. 3, 2016", 8 pgs.

"U.S. Appl. No. 14/555,927, Response filed Feb. 9, 2016 to Non Final Office Action dated Oct. 9, 2015", 11 pgs.

"International Application No. PCT/AU2019/050651, International Search Report and Written Opinion dated Sep. 3, 2019", (Sep. 3, 2019), 9 pgs.

Ball, Harrison, et al., "Walsh-synthesized noise filters for quantum logic", EPJ Quantum Technology, vol. 2, Issue 11, (Sep. 12, 2013), 45 pgs.

Biercuk, Michael J., et al., "High-Fidelity Quantum Control Using Ion Crystals in a Penning Trap", Quantum Information and Computation, vol. 9, No. 11-12, (Aug. 19, 2009), 0920-0949.

Blanes, S., et al., "The magnus expansion and some of its applications", Phys. Rep., 470:151, (2009), 165 pgs.

Bylander, Jonas, et al., "Noise spectroscopy through dynamical decoupling with a superconducting flux qubit", Nature Physics, vol. 7, (May 8, 2011), 565-570.

Faoro, Lara, et al., "Dynamical suppression of 1/f noise processes in quibit systems", Phys. Rev. Lett., 92:117905, (2004), 4 pgs.

Green, Todd J., et al., "Arbitrary quantum control of qubits in the presence of universal noise", New J. Phys., 15:095004, (Sep. 12, 2013), 29 pgs.

Hagemann, C., et al., "Providing 10-16 Short-Term Stability of a 1.5- μm Laser to Optical Clocks", IEEE Transactions on Instrumentation and Measurement, 62(6), (2013), 1-6.

Harmuth, Henning F., "Applications of Walsh functions in communications", IEEE Spectrum, 6:82, (Nov. 1969), 10 pgs.

Magnus, Wilhelm, "On the Exponential Solution of Differential Equations for a Linear Operator", Communications on Pure and Applied Mathematics, vol. 7, Issue 4, (Nov. 1954), 649-673.

Miller, Scott L., "Probability and Random Processes with Applications to Signal Processing and Communications", Edition 2, Academic Press, Boston, MA, (2012), 4 pgs.

Mullan, Michael, et al., "Optimizing Passive Quantum Clocks", arXiv:1404.3810v1 [quant-ph] Apr. 15, 2014; Department of Physics, University of Colorado, Boulder, Colorado; and National Institute of Standards and Technology, Boulder, Colorado, (Apr. 15, 2014), 25 pgs.

Rutman, Jacques, "Characterization of phase and frequency instabilities in precision frequency sources: Fifteen years of progress", Proceedings of the IEEE, vol. 66, Issue 9:1048, (Sep. 1978), 1048-1075.

Schumacher, Benjamin, "Sending entanglement through noisy quantum channels", Phys. Rev. A., 54:2614, (1996), 39 pgs.

Van Harlingen, D. J., et al., "Decoherence in Flux Qubits Due to 1/f Noise in Josephson Junctions", Quantum Computing and Quantum bits in Mesoscopic Systems, Edited by Leggett et al., Kluwer Academic Press, New York, (2004), 171-184.

Zhang, Wenxian, et al., "Dynamical control of electron spin coherence in a quantum dot", Phys. Rev. B, 75:201302, (2007), 4 pgs.

MULTI-QUBIT CONTROL

CROSS-REFERENCE TO RELATED APPLICATIONS

This application is a U.S. national stage filing under 35 U.S.C.§ 371 from International Application No. PCT/AU2019/050651, filed on 24 Jun. 2019, and published as WO2020/019015 on 30 Jan. 2020, which claims the benefit of priority from Australian Provisional Patent Application No 2018247327 filed on 12 Oct. 2018 and Australian Patent No 2018902650 filed on 23 Jul. 2018, the benefit of priority of each of which is claimed herein, and which applications and publication are incorporated herein by reference in their entirety.

TECHNICAL FIELD

This disclosure relates to evaluating and improving performance of a control implementation on a quantum processor comprising multiple qubits in the presence of noise.

BACKGROUND

Quantum computers are an emerging technology and a number of different technologies exist to implement quantum computers, including trapped ions, nitrogen vacancies in diamond, superconducting circuits, and electron and nuclear spins in semiconductors and other crystal structures. For each of these technologies there are a wide range of different configurations and microscopic details, such as the number and spatial arrangement of qubits implemented, connectivity between qubits, available controls, or the physical environments experienced by the qubits. As a result, each quantum computer has its own specific characteristics that makes it different to other quantum computers.

However, one common theme for quantum computers is that quantum information deteriorates quickly and complex algorithms are required to create control protocols that can stabilize the quantum information. Due to both the high variability between quantum computing hardware and the inherent computational challenges, it is difficult to determine and execute these control algorithms for a particular quantum computer which holds back the effective use of quantum computing technology.

FIG. 1 illustrates a quantum processor 101 that implements one or more operations on multiple qubits 102. In this example, the multiple qubits are in the form of a 5-by-3 array of qubits but other arrangements including linear arrays and other structures with many more qubits are equally possible. Similarly, nearest-neighbor couplings are illustrated, but other coupling architectures (e.g. next-nearest neighbor) are also equally possible. Example architectures that can be controlled using the disclosed system include Google's Bristlecone and IBM's Q Experience. Operations implemented by quantum processor 101 may include a universal gate set to perform "circuit model" quantum computing, entangling operations for measurement-based quantum computing, adiabatic evolutions for adiabatic quantum computing, or "analog" quantum simulations.

There is now also shown a control signal source 103 which generates a control signal 104 to control the qubits 102. The control signal may be an RF, microwave, or optical signal depending on the physical implementation of the qubits. It may be delivered globally or locally to the qubits, depending on the architecture and implementation. The signal may be individually tailored for each qubit or may be applied homogeneously to all qubits. The control signal 104 may be the same signal generally used to apply quantum operations to qubits 102, or may be a separate parallel control system. More specifically, the control signal 104 may have a first component to control the qubit operations, such as load quantum information onto the qubits, perform quantum logic operations, enable interaction, and read-out the resulting qubit information. On top of the first component, there is a second component that reduces the influence of noise on the qubits as will be described in more detail below. The first and second components may be separate in the sense that they are generated by separate sources or even using separate physical devices, such as RF, laser, MW, etc.

FIG. 1 also shows an environment 105 in which the qubits 102 operate. Environment 105 is drawn as an irregular shape to indicate that it is relatively difficult to accurately characterize and behaves in a random manner, though it may exhibit correlations in space and time. More particularly, qubits 102 interact with the environment in an undesired but unavoidable way. For example, qubits 102 may interact with the environment 105 through various mechanisms which leads to decoherence of the quantum information stored on qubits 102, and decoherence-induced errors in quantum logic operations applied to qubits 102. Environment 105 may be the same across many qubits 102 in processor 101, or may vary strongly between qubits. Without countermeasures, this decoherence results in errors which significantly diminish the performance of the individual quantum logic operations within the quantum processor, and of the ultimate algorithm executed on the quantum processor, unless decoherence is reduced. It is therefore the task of control signal 104 to control qubits 102 such that the effects of decoherence are reduced. This control signal reduces the effects of decoherence even when control signal 104 itself is imperfect and contributes its own decoherence-inducing noise characteristics.

FIG. 2 illustrates a simplified example of a single qubit 200 whose quantum state is represented as a Bloch vector on a Bloch sphere 201 where the north pole 202 represents the |1> basis state (e.g. up spin) and the south pole 203 represents the |0> basis state (e.g. down spin). The current quantum information may be encoded as a superposition of the two basis states as indicated by first vector 203. In the current example the objective is to perform an idle operation, or memory. As a result of the interaction of the qubit 200 with the environment 105 the vector rotates by an unknown and uncontrolled amount, and after a certain time arrives at a different position as indicated by second vector 204. This corresponds to a randomization of the information encoded in the qubit state, described by the state vector. It is now possible to apply a control signal that 'flips' the second vector 204 by 180 degrees arriving at a new position as indicated by third vector 205. If the control signal is then turned off for the same time as between 203 and 204, the third vector 205 will rotate exactly to the position of the first vector 203 due to the interaction with the environment 105. As a result, the influence of the noise as described by the interaction with the environment 105 in this case is perfectly eliminated. This is a simple example of open-loop (measurement-free) control which stabilizes a quantum state against environmental decoherence. This control protocol therefore provides correction of the qubit state 203 against environmental interference, but avoids direct measurement of either the environment 105 or the qubit states 203 or 204. This is particularly powerful as the measurement process causes the collapse of quantum information, rendering it useless for quantum computation.

FIG. 3 illustrates a corresponding control sequence 300 that applies a single control pulse 301 between $t_1$ 302 and $t_2$ 303 to flip the qubit as shown in FIG. 2. In this example, this means that RF source 103 is turned on at $t_1$ and turned off at $t_2$.

While the example in FIGS. 2 and 3 provides perfect elimination of outside noise due to a time-independent, or static "dephasing" interaction with environment 105, the situation is more complicated in practical cases. In particular, the multiple qubits 102 interact with each other and with the environment 105 in different and potentially random ways. This is especially difficult to control where only one single signal 104 can be applied to all qubits 102 simultaneously.

Further, most interactions with the environment 105 and between qubits 102 in general cannot be corrected by a single pulse but require multiple complex controls forming a sequence; the timing and properties of each segment within the sequence is chosen to optimize the performance of the desired operation (including but not limited to memory (I), bit flip (X), phase flip (Z), T, S, CNOT, CPHASE, or other entangling gates) under the influence of general time-varying noise.

It is even more complicated to determine such control sequences in circumstances where the effect of the environment 105 and control induced by system 104 do not quantum mechanically commute. This is a particular condition which occurs in many quantum processors and also adds significant complexity to the problem of defining controls in real circumstances. For instance, the application of a quantum bit flip (X) gate in the presence of dephasing noise constitutes such an example. Overall, it is difficult to accurately determine sequences to compensate for noise in such a scenario.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

There is provided a method for evaluating and improving performance of a control implementation on a quantum processor comprising multiple qubits in the presence of noise. The method comprises:

modelling the noise by decomposing noise interactions described by a multi-qubit noise Hamiltonian into multiple contributory noise channels, each channel generating noise dynamics described by a unique noise-axis operator $A^{(i)}$, where (i) indexes the ith noise channel;

determining, for a given control implementation, the unique filter function for each noise channel representing susceptibility of the multi-qubit system to the associated noise dynamics, each of the multiple filter functions being based on a frequency transformation ($\mathcal{F}$) of the noise axis operator ($A^{(i)}$) of the corresponding noise channel (i) to thereby evaluate the performance of the control implementation;

determining an optimised control sequence based on the filter function to reduce the susceptibility of the multi-qubit system to the noise channels, thereby reducing the effective interaction with the multi-qubit noise Hamiltonian;

applying the optimised control sequence to the multi-qubit system to control the quantum processor to thereby improve the performance of the control implementation.

It is an advantage that the method reduces the noise influence on the multiple qubits—which left unaddressed causes hardware failure—because the method calculates the filter function and determines a noise-suppressing control sequence based on the filter function. Therefore, the multiple qubits can be used at a higher fidelity, that is, at a lower error rate.

The multi-qubit noise axis operators may be linear operators.

The combination of the noise axis operators may comprises a weighting of each noise axis operator by a random variable.

The combination may be a linear combination of the noise axis operators weighted by respective random variables.

Each of the multiple filter functions may be based on a frequency transformation of a control Hamiltonian (U_c) applied to the noise axis operator.

The control Hamiltonian may represent an operation on multiple qubits.

A gate set of the quantum processor may comprise entangling operations and the control Hamiltonian includes the entangling operations between the multiple qubits.

The control Hamiltonian (U_c) applied to the noise axis operator may form a toggling frame noise axis operator.

The toggling frame noise axis operator may represent control dynamics relative to the noise axis excluding stochastic content of the noise.

The noise axis operator may be in the Hilbert space of the multiple qubits.

The noise axis operator may be time varying.

The dimensions of the noise axis operator may be equal to the dimensions of a Hamiltonian of the multiple qubits.

The noise axis operator may be based on a non-Markovian error model.

The noise axis operator may be based on one or more measurements of an environment of the quantum processor.

Each filter function may be based on a sum over dimensions of the noise axis operator of the frequency transformation.

Determining a control sequence based on the filter function may be to reduce the noise influence on the operation on the multiple qubits.

The method may further comprise mapping operators for a multi-qubit system to an effective control Hamiltonian of reduced dimensionality, wherein each of the multiple filter functions is based on a frequency transformation of the effective control Hamiltonian (U_c) applied to the noise axis operator such that the optimized control sequence represents a multi-qubit control solution.

A quantum processor comprises multiple qubits and a controller configured to:

model the noise by decomposing noise interactions described by a multi-qubit noise Hamiltonian into multiple contributory noise channels, each channel generating noise dynamics described by a unique noise-axis operator $A^{(i)}$, where (i) indexes the ith noise channel;

determine, for a given control implementation, the unique filter function for each noise channel representing susceptibility of the multi-qubit system to the associated noise dynamics, each of the multiple filter functions being based on a frequency transformation ($\mathcal{F}$) of the noise axis operator ($A^{(i)}$) of the corresponding noise channel (i) to thereby evaluate the performance of the control implementation;

determine an optimised control sequence based on the filter function to reduce the susceptibility of the multi-qubit system to the noise channels, thereby reducing the effective interaction with the multi-qubit noise Hamiltonian;

apply the optimised control sequence to the multi-qubit system to control the quantum processor to thereby improve the performance of the control implementation.

DESCRIPTION OF EMBODIMENTS

As set out above, the influence of noise is a significant problem that causes deterioration of quantum states. In particular, for multiple qubit systems, this noise interaction is difficult to eliminate because the modelling and the calculation of a suitable control sequence appropriate for either multiple interacting qubits or entangling operations is difficult.

This disclosure provides a method for quantum control that evaluates and improves the performance of a quantum processor under a given control implementation. This means that the quantum processor is operated under the control of a signal that essentially implements the desired operations, such as loading quantum information onto the multiple qubits, evolving and manipulating the quantum states for a certain time, and reading out the resulting quantum information from the qubits potentially employing quantum error correction. These steps (and potentially others) are referred to as control implementation as they govern the control of the nominal behavior of the quantum processor without noise.

The disclosed method uses the notion of multiple noise channels which, when added together, represent the full noise influence noting that each noise channel may apply to all qubits so the number of qubits and the number of noise channels are different in most cases. The disclosed method then models the noise as a decomposed noise Hamiltonian and each element of that decomposition represents the influence of one of the noise channels. More particularly, each element comprises a noise axis operator that is a linear (matrix) operator and each noise axis operator applies to all qubits and one noise channel. When applied to the control Hamiltonian (representing the control implementation described above) the result is referred to as a "toggling frame noise operator".

The advantage of the linear noise axis operator and the additive noise channels is that a Fourier transform of the operator can be calculated to determine a filter function representing the noise influence during the selected control. Once the filter function is known, it can be used to improve the performance of the quantum processor by eliminating the noise influence as much as possible.

Figure 1:
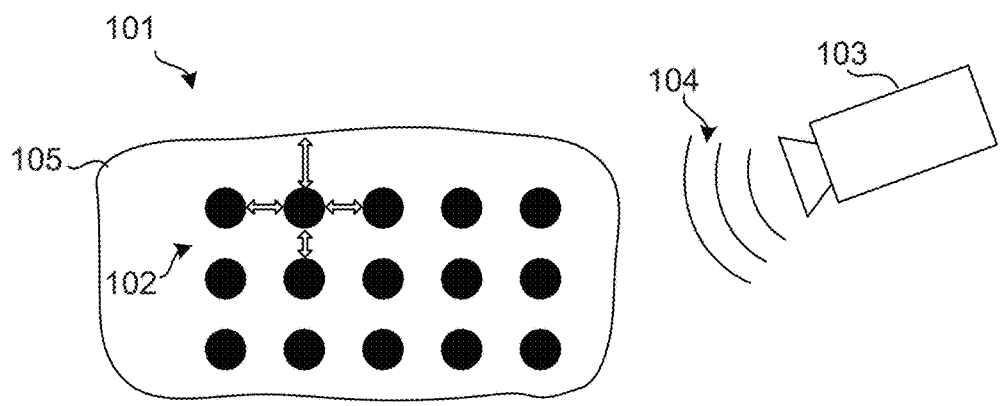
FIG. 1 illustrates a quantum processor.
Figure 2:
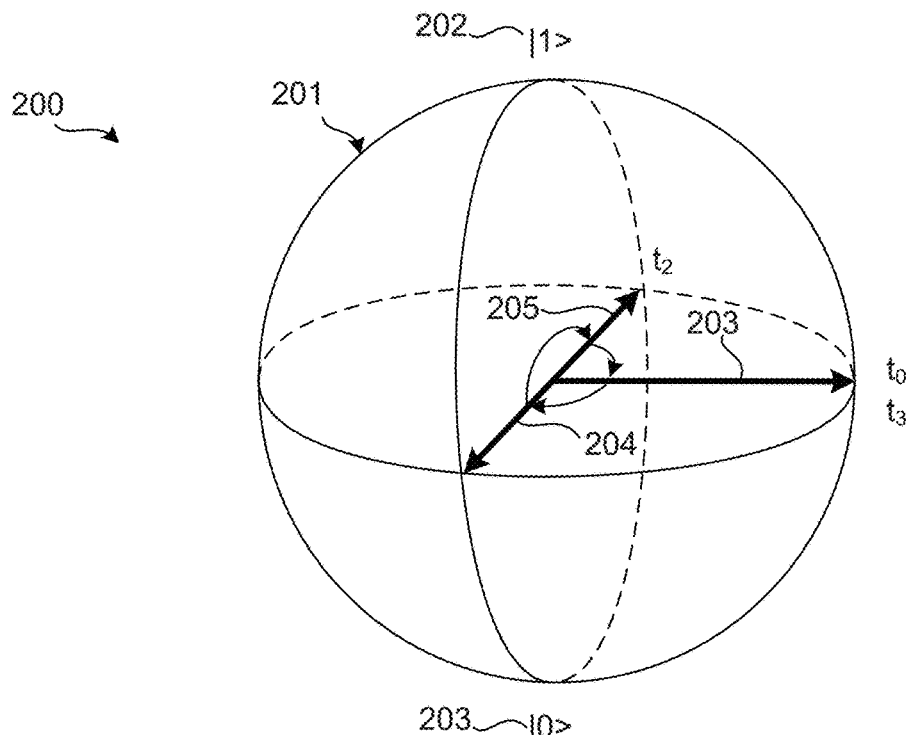
FIG. 2 illustrates a simplified example of a single qubit whose quantum state is represented as a Bloch vector on a Bloch sphere.
Figure 3:
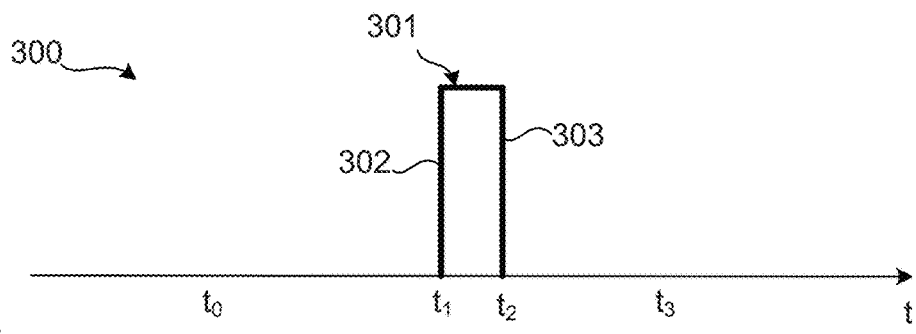
FIG. 3 illustrates a control sequence.
Figure 4:
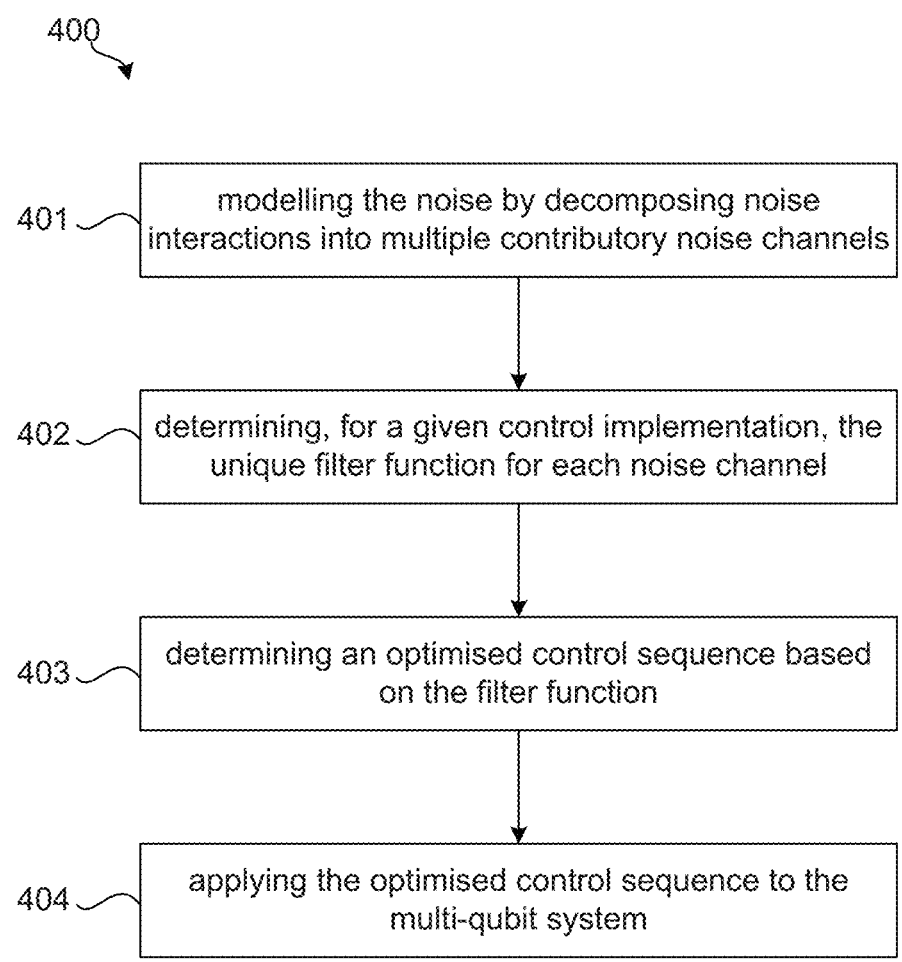
FIG. 4 illustrates a method for evaluating and improving performance of a control implementation on a quantum processor.

The method is now explained on relatively broad terms with reference to FIG. 4 and after that, a rigorous mathematical formulation is provided. The broad explanation provides equation symbols that are used in the mathematical formulation to establish a link between both parts of this disclosure.

FIG. 4 illustrates a method 400 for evaluating and improving performance of a control implementation on a quantum processor comprising multiple qubits in the presence of noise. It is noted that method 400 may be performed by a classical computer system comprising a processor and non-transitory computer readable medium acting as program memory with computer instructions stored thereon. The processor may be a commercially available processor, such as Intel Pentium, or an FPGA or custom made ASIC. The instructions cause the processor to perform method 400. The mathematical formulations of further features of method 400 and other methods may also be implemented as program code and installed on the program memory of the classical computer system.

The method commences by modelling 401 the noise by decomposing noise interactions described by a multi-qubit noise Hamiltonian $H_0(t)$ into multiple contributory noise channels. Each channel generates noise dynamics described by a unique noise-axis operator $A^{(i)}$ where (i) indexes the ith noise channel (Eq. 6 below);

The next step is to determine 402, for a given control implementation $H_c(t)$, the unique filter function F according to $$F_i(\omega) = \frac{1}{D}\sum_{l=1}^{D}\sum_{q=1}^{D}\left|[\mathcal{F}[\tilde{A}_0^{(i)}]]_{l,q}\right|^2$$

(which is Eq. (85) below). That is, the filter function F is calculated for each noise channel i and represents susceptibility of the multi-qubit system to the associated noise dynamics. Each of the multiple filter functions F is based on a frequency transformation $\mathcal{F}$ of the noise axis operator $\tilde{A}_0^{(i)}$ of the corresponding noise channel i. It is noted that $\tilde{A}_0^{(i)}$ in the above equation is the toggling frame noise axis operator. Determining a filter function essentially means that the performance of the quantum processor is evaluated as it shows the noise influence at various noise frequencies.

Returning back to the noise characteristics, in some examples decoherence in quantum systems is dominated by time-dependent non-Markovian noise processes with long correlations, characterized by low-frequency dominated noise power spectra [1, 2 3, 4, 5]. These may arise either from environmental fluctuations or—in the important case of driven quantum systems—from noise in the control device itself such as that implementing either single or multi-qubit operations [6]. In either case, the result is a reduction in the fidelity of a target control operation, including both memory and nontrivial operations. These phenomena present a major challenge as quantum devices move from proof of principle demonstrations to realistic applications, where performance demands on the quantum devices are frequently extreme. Accordingly, finding ways to control quantum systems efficiently and effectively in the presence of noise is a central task in quantum control theory.

It is then possible to determine 403 an optimised control sequence based on the filter function to reduce the susceptibility of the multi-qubit system to the noise channels. Given known noise, characterized by its power spectral density as a function of frequency, the overall performance of the quantum operation is determined by the overlap integral of the noise and filter function in frequency space. A control which exhibits a filter function with a small numerical value where the noise power spectral density is largest reduces the qubit's effective interaction with the multi-qubit noise Hamiltonian and therefore reduces the overall noise influence on and degradation of that gate. This may be achieved over a broad low-frequency band, or over specific narrow frequency ranges, or both simultaneously. Therefore once calculated, the control sequence may be iteratively modified to ensure both the target operation is achieved and the desired filtering performance achieved.

Finally, the optimised control sequence is applied 404 to the multi-qubit system to control the quantum processor to thereby improve the performance of the control implementation in the sense that the multiple qubits are now less susceptible to noise degradation during either idle (memory) or nontrivial quantum logic operations, and can therefore perform at a significantly reduced error rate.

The remainder of this disclosure sets out the formalism for computing filter functions for a very broad class of control and noise Hamiltonians, suitable for both analytic and numeric computation, and covering most quantum systems currently being studied around the world for the purpose of quantum information processing.

At first, it is helpful to express the Hamiltonian framework for the control and noise interactions, though without making further restrictions as to the dimension of the system, or number of qubits/particles, or the interactions between them. Thus $$H(t) = H_c(t) + H_0(t) \quad (1)$$

where $H_c(t)$ describes perfect control of the system, e.g. via an ideal external driving field, and the noise Hamiltonian $H_0(t)$ captures undesirable time-varying interactions with a noise process. The system evolves under the Schrödinger equation $$i\dot{U}(t, 0) = H(t)U(t, 0) \quad (2)$$

$$U(t, 0) = \mathcal{T}\exp\left(-i\int_0^t H(t')dt'\right) \quad (3)$$

where $\mathcal{T}$ denoting the time-ordering operator, and the time-evolution operator $U(t, 0)$ transforms an initial state $|\psi(0)\rangle$ to the final $U(\Sigma,0)|\psi(0)\rangle$ after an interaction of duration $\tau$. In the absence of noise the total Hamiltonian reduces to $H(t)=H_c(t)$, in which case the target evolution path under ideal control is governed by $$i\dot{U}_c(t, 0) = H_c(t)U_c(t, 0) \quad (4)$$

$$U(t, 0) = \mathcal{T}\exp\left(-i\int_0^t H_c(t')dt'\right) \quad (5)$$

being independent of any noise processes.

Noise processes can be modelled semi-classically in terms of stochastic time-dependent fluctuating classical noise fields. Without further specificity, the noise Hamiltonian is expressed as a combination of n noise channels, which may be written as a sum of n noise channels $$H_0(t) = \sum_{i=1}^n \beta_i(t)A^{(i)}(t) \quad (6)$$

where the noise axis operator $A^{(i)}$ is not a stochastic variable, rather an operator defining the "axis" of the noise (possibly changing in time) in the Hilbert space of the system. In this model the noise fields A(t) are assumed to be classical random variables with zero mean and non-Markvovian power spectra. They are also assumed wide sense stationary (w.s.s.) and independent. The assumption of independence is reasonable, for instance, in the case of a driving field where random fluctuations in frequency and amplitude arise from different physical processes. A general model including correlations between noise processes is possible, however, following the approach outlined by Green et al. [7]. The assumption of w.s.s. implies the autocorrelation functions $$C_i(t_2-t_1) \equiv \langle \beta_i(t_1)\beta_i(t_2) \rangle, i \in \{1, \ldots, n\} \quad (7)$$

depend only on the time difference $t_1-t_2$. Moreover the autocorrelation function for each noise channel may be related to the Fourier transform of the associated PSD $S_i(\omega)$ using the Wiener-Khinchin Theorem [8]. Namely $$C_i(t_2 - t_1) = \frac{1}{2\pi}\int_{-\infty}^{\infty} S_i(\omega)e^{i\omega(t_2-t_1)}d\omega. \quad (8)$$

The assumption of independence implies the cross-correlation functions vanish. That is, $$\langle \beta_j(t_1)\beta_k(t_2) \rangle = 0, j \neq k \in \{1, \ldots, n\} \quad (9)$$

The angle brackets here denote a time average of the stochastic variables. Finally, this model permits access to a wide range of parameter regimes, from quasistatic (noise slow compared to $H_c(t)$) to the limit in which the noise fluctuates on timescales comparable to or faster than $H_c(t)$.

These noise Hamiltonians generate uncontrolled rotations in the qubit dynamics, leading to errors in the evolution path (and hence the final state) relative to the target transformation intended under $H_c(t)$. An estimate for this error is derived in the following description using a first order expansion of operators, resulting in a generic description in terms of associated filter functions.

Generic Filter Functions

The proposed process uses a measure for the operational fidelity in the presence of both noise and the relevant control. For this, the method developed by Green et al. [18] can be referenced. We note that fidelity may not be the only relevant metric—a wide range of measurable parameters may be calculated in the same framework. In the current framework the error contributed by the noise fields over the duration of the control is approximated, to first order, via a truncated Magnus expansion. Each noise field then contributes a term to the gate infidelity in the spectral domain expressed as an overlap integral between the noise power spectrum and an appropriate generalized filter-transfer function.

Operational Fidelity

In the absence of noise interactions, the target state evolution is described by $U_c(t)$ and determined by Eq (4). Noise interactions under $H_0$ steer the operation away from this target resulting in the net operation U(t) determined by Eq (18). Average operational fidelity may therefore be expressed $$\mathcal{F}_{av}(\tau) = \left\langle \left| \frac{1}{D} Tr(U_c^\dagger(\tau) U(\tau)) \right|^2 \right\rangle \quad (10)$$

effectively measuring the extent to which the intended and realized operators "overlap", as captured by the Hilbert-Schmidt inner product [9]. Here D is the dimension of the Hilbert space. This ensures that we recover unit fidelity when there is no noise. Namely, if $U=U_c$ we obtain $$\mathcal{F}_{av}(\tau) = \left\langle \left| \frac{1}{D} Tr(U_c^\dagger U_c) \right|^2 \right\rangle = \left\langle \left| \frac{1}{D} Tr(\hat{\mathbb{1}}) \right|^2 \right\rangle = \left\langle \left| \frac{1}{D} D \right|^2 \right\rangle = 1 \quad (11)$$

Toggling Frame

Computing the evolution dynamics such to evaluate Eq. (10) is challenging since the control and noise Hamiltonians may not commute at different times; sequential application of the resulting time-dependent, non-commuting operations gives rise to both dephasing and depolarization errors, mandating approximation methods.

The proposed error model assumes non-dissipative qubit evolution with both control and noise interactions resulting in unitary rotations. Hence, the evolution operator is approximated as a unitary using a Magnus expansion [10, 11]. This involves moving to a frame co-rotating with the control known as the toggling frame, see also [12]. This approach allows to separate the part of the system evolution due solely to the control from the part affected by environmental coupling.

Let the error between the full and ideal unitaries, U and $U_c$, be expressed in terms of the error unitary $\tilde{U}$ such that $U = U_c \tilde{U}$. In this case we obtain the following equivalent relations $$U = U_c \tilde{U} \quad (12)$$

$$\tilde{U} = U_c^\dagger U \quad (13)$$

$$U_c^\dagger = \tilde{U} U^\dagger. \quad (14)$$

Computation of Eq. (10) may therefore be performed using Eq. (13), yielding $$\mathcal{F}_{av}(\tau) = \left\langle \left| \frac{1}{D} Tr(\tilde{U}(\tau)) \right|^2 \right\rangle \quad (15)$$

Perfect control therefore corresponds to $\tilde{U}(\tau) \to \hat{\mathbb{1}}$. But how to compute $\tilde{U}(\tau)$? Taking the time derivative of Eq. (13) we obtain $$\dot{\tilde{U}} = \dot{U}_c^\dagger U + U_c^\dagger \dot{U} \quad (16)$$

$$= \dot{U}_c^\dagger (U_c \tilde{U}) + (\tilde{U} U^\dagger) \dot{U} \quad (17)$$

Now from Eq. (18) and Eq. (4), and observing that $H_c^\dagger = H_c$, we also have $$i\dot{U} = HU \Leftrightarrow \dot{U} = -iHU \quad (18)$$

$$i\dot{U} = H_c U_c \Leftrightarrow \dot{U}_c^\dagger = iU_c^\dagger H_c \quad (19)$$

Substituting these into Eq. (17) we therefore have $$\dot{\tilde{U}} = iU_c^\dagger H_c (U_c \tilde{U}) - i(\tilde{U} U^\dagger) HU \quad (20)$$

$$= i(U_c^\dagger H_c U_c) \tilde{U} - i \tilde{U} (U^\dagger H U) \quad (21)$$

$$= i(U_c^\dagger H_c U_c) \tilde{U} - i(\tilde{U} U^\dagger) HU \quad (22)$$

Now substituting in Eq. (12) and Eq. (14) yields $$\dot{\tilde{U}} = i(U_c^\dagger H_c U_c) \tilde{U} - i U_c^\dagger H U_c \tilde{U} \quad (23)$$

$$= i(U_c^\dagger H_c U_c - U_c^\dagger H U_c) \tilde{U} \quad (24)$$

$$= i(U_c^\dagger H_c U_c - U_c^\dagger (H_c + H_0) U_c) \tilde{U} \quad (25)$$

$$= -i(U_c^\dagger H_0 U_c) \tilde{U} \quad (26)$$

Thus, defining the toggling frame Hamiltonian $$\tilde{H}_0(t) \equiv U_c^\dagger(t) H_0(t) U_c(t) \quad (27)$$

the error propagator is $\tilde{U}$ satisfies the Schrödinger equation $$i\dot{\tilde{U}}(t) = \tilde{H}_0(t) \tilde{U}(t). \quad (28)$$

and we may perform a Magnus expansion in this frame to approximate $\tilde{U}(\tau)$.

Magnus Expansion

Assuming convergence of the Magnus series [11] it is possible to obtain an arbitrarily accurate unitary estimate of the error propagator $\tilde{U}$ governed by Eq. (28), by performing a Magnus expansion. In particular, at the end of the evolution time $\tau$, we may write $$\tilde{U}(\tau) = \exp[-i\Phi(\tau)] \quad (29)$$

where the effective error operator is expands as $$\Phi(\tau) = \sum_{\mu=1}^{\infty} \Phi_\mu(\tau) \quad (30)$$

with the first few Magnus expansion terms expressed as $$\Phi_1(\tau) = \int_0^\tau dt \tilde{H}_0(t) \quad (31)$$

$$\Phi_2(\tau) = -\frac{i}{2} \int_0^\tau dt_1 \int_0^{t_1} dt_2 [\tilde{H}_0(t_1), \tilde{H}_0(t_2)]$$

$$\Phi_3(\tau) = \frac{1}{6} \int_0^\tau dt_1 \int_0^{t_1} dt_2 \int_0^{t_2} dt_3 \{[\tilde{H}_0(t_1), [\tilde{H}_0(t_2), \tilde{H}_0(t_3)]] +$$

$$[\tilde{H}_0(t_3), [\tilde{H}_0(t_2), \tilde{H}_0(t_1)]]\}$$

...

These generally take the form of time-ordered integrals over nested commutators in $\tilde{H}_0(t)$. Assuming the noise fields $\beta_i(t)$ are sufficiently weak, we may make the lowest order approximation that $$\tilde{U}(\tau) \approx \exp[-i\Phi_1(\tau)] \quad (32)$$

by truncating the error operator to first order as $$\Phi(\tau) \approx \Phi_1(\tau) = \int_0^\tau dt \tilde{H}_0(t) \quad (33)$$

Exponential Expansion of First Order Error Unitary

We assert the toggling frame Hamiltonian is both Hermitian and traceless:

$$\tilde{H}_0 = \tilde{H}_0^\dagger, \quad Tr(\tilde{H}_0) = 0. \quad (34)$$

From Eq. (33), and due to the linearity of integration, it follows the first order error propagator also satisfies these properties:

$$\Phi_1 = \Phi_1^\dagger, \quad Tr(\Phi_1) = 0. \quad (35)$$

Now, for an n×n real or complex matrix X, the exponentiated matrix may be expressed as the power series $$\exp[X] = \sum_{k=0}^{\infty} \frac{1}{k!} X^k. \quad (36)$$

Consequently, Eq. (32) expands as $$\tilde{U}(\tau) = \hat{\mathbb{1}} - i\Phi_1 - \frac{1}{2}\Phi_1^2 + \ldots \quad (37)$$

$$= \hat{\mathbb{1}} - i\Phi_1 - \frac{1}{2}\Phi_1 \Phi_1^\dagger + \ldots \quad (38)$$

where we have truncated to the lowest order term that (non-trivially) survives the trace operation in Eq. (15).
Operational infidelity: first order approximation
Substitution of this expansion into Eq. (15) yields $$\mathcal{F}_{av}(\tau) = \left\langle \left| \frac{1}{D} Tr\left(\hat{\mathbb{1}} - i\Phi_1 - \frac{1}{2}\Phi_1 \Phi_1^\dagger + \ldots\right) \right|^2 \right\rangle \quad (39)$$

$$\approx \left\langle \left| \frac{1}{D} Tr(\hat{\mathbb{1}}) - \frac{1}{D} Tr\left(\frac{1}{2}\Phi_1 \Phi_1^\dagger\right) \right|^2 \right\rangle \quad (40)$$

$$= \left\langle \left| 1 - \frac{1}{D} Tr\left(\frac{1}{2}\Phi_1 \Phi_1^\dagger\right) \right|^2 \right\rangle \quad (41)$$

$$= \left\langle \left[1 - \frac{1}{D} Tr\left(\frac{1}{2}\Phi_1 \Phi_1^\dagger\right)\right]^* \left[1 - \frac{1}{D} Tr\left(\frac{1}{2}\Phi_1 \Phi_1^\dagger\right)\right] \right\rangle \quad (42)$$

$$= \left\langle 1 - \frac{2}{D} Tr\left(\frac{1}{2}\Phi_1 \Phi_1^\dagger\right) + O(|\Phi_1|^4) \right\rangle \quad (43)$$

The last line uses the following result. For the n×n Hermitian operator $$A = A^\dagger \iff A_{ij} = [A^\dagger]_{ij} = A^*_{ji} \quad (44)$$

therefore $$[AA^\dagger]_{ij} = \sum_{k=1}^{n} A_{ik}[A^\dagger]_{kj} = \sum_{k=1}^{n} A_{ik} A^*_{jk} \quad (45)$$

therefore $$Tr[AA^\dagger] = \sum_{i=1}^{n}[AA^\dagger]_{ii} = \sum_{i=1}^{n}\sum_{k=1}^{n} A_{ik} A^*_{ik} = \sum_{i=1}^{n}\sum_{k=1}^{n} |A_{ik}|^2 \in \mathbb{R} \quad (46)$$

Consequently $$Tr\left(\frac{1}{2}\Phi_1 \Phi_1^\dagger\right)^* = Tr\left(\frac{1}{2}\Phi_1 \Phi_1^\dagger\right) \quad (47)$$

Ignoring terms beyond $\mathcal{O}(|\Psi_1|^2)$ we therefore obtain $$\mathcal{F}_{av}(\tau) = \left\langle 1 - \frac{2}{D} Tr\left(\frac{1}{2}\Phi_1 \Phi_1^\dagger\right) \right\rangle \quad (48)$$

$$= 1 - \frac{2}{2D}\langle Tr(\Phi_1 \Phi_1^\dagger)\rangle \quad (49)$$

$$= 1 - \frac{1}{D} Tr(\langle \Phi_1 \Phi_1^T\rangle) \quad (50)$$

Convert to Frequency Domain
Therefore, a first order approximation to infidelity can be expressed as $$1 - \mathcal{F}_{av} = \frac{1}{D} Tr(\langle \Phi_1 \Phi_1^\dagger \rangle) \quad (51)$$

$$= \frac{1}{D} Tr\left(\left\langle \left(\int_0^\tau dt_1 \tilde{H}_0(t_1)\right)\left(\int_0^\tau dt_2 \tilde{H}_0(t_2)\right)^\dagger \right\rangle\right) \quad (52)$$

$$= \frac{1}{D} Tr\left(\left\langle \int_0^\tau dt_1 \int_0^\tau dt_2 \tilde{H}_0(t_1) \tilde{H}(t_2)^\dagger \right\rangle\right) \quad (53)$$

Now, from the definitions in Eq. (6) and (27) and we have $$\tilde{H}_0 = U_c^\dagger H_0 U_c = U_c^\dagger \left(\sum_{i=1}^n \beta_i A^{(i)}\right) U_c = \sum_{i=1}^n \beta_i U_c^\dagger A^{(i)} U_c \equiv \sum_{i=1}^n \beta_i \tilde{A}_0^{(i)} \quad (56)$$

where we have defined the toggling frame noise axis operator $$\tilde{A}_0^{(i)} \equiv U_c^\dagger A^{(i)} U_c. \quad (57)$$

which holds for arbitrary Hilbert space dimension D.
NOTE: the noise axis operator $A^{(i)}$ is not a stochastic variable, rather an operator defining the axis of the noise. Therefore the toggling frame noise axis operator $\tilde{A}_0^{(i)}$, consisting of a transformed operator via conjugation by the control unitary $U_c$, does not capture any information about the stochastic content of the noise, rather it captures information about the control dynamics relative to a noise axis of interest.

Inserting this into Eq. (6), we therefore have $$1 - \mathcal{F}_{av} = \quad (58)$$

$$\frac{1}{D} Tr\left(\left\langle \int_0^\tau dt_1 \int_0^\tau dt_2 \left(\sum_{i=1}^n \beta_i(t_1) \tilde{A}_0^{(i)}(t_1)\right)\left(\sum_{j=1}^n \beta_j(t_2) \tilde{A}_0^{(j)}(t_2)\right)^\dagger \right\rangle\right)$$

$$= \frac{1}{D} Tr\left(\left\langle \sum_{i=1}^n \sum_{j=1}^n \int_0^\tau dt_1 \int_0^\tau dt_2 \beta_i(t_1)\beta_j(t_2) \tilde{A}_0^{(i)}(t_1)(\tilde{A}_0^{(j)}(t_2))^\dagger \right\rangle\right) \quad (59)$$

$$= \frac{1}{D} Tr\left(\sum_{i=1}^n \sum_{j=1}^n \int_0^\tau dt_1 \int_0^\tau dt_2 \langle\beta_i(t_1)\beta_j(t_2)\rangle \tilde{A}_0^{(i)}(t_1)(\tilde{A}_0^{(j)}(t_2))^\dagger \right) \quad (60)$$

From Eq. (9) all cross correlations are zero, consequently $$1 - \mathcal{F}_{av} = \frac{1}{D} Tr\left(\sum_{i=1}^n \int_0^\tau dt_1 \int_0^\tau dt_2 \langle\beta_i(t_1)\beta_i(t_2)\rangle \tilde{A}_0^{(i)}(t_1)(\tilde{A}_0^{(i)}(t_2))^\dagger \right) \quad (61)$$

$$= \frac{1}{D} Tr\left(\sum_{i=1}^n \int_0^\tau dt_1 \int_0^\tau dt_2 C_i(t_2 - t_1) \tilde{A}_0^{(i)}(t_1)(\tilde{A}_0^{(i)}(t_2))^\dagger \right) \quad (62)$$

We may now move to the frequency domain using the Wienner-Khintchine theorem described in Eq. (8). Namely $$1 - \mathcal{F}_{av} = \frac{1}{D} Tr\left(\sum_{i=1}^{n} \int_0^\tau dt_1 \int_0^\tau dt_2 \left(\frac{1}{2\pi} \int_{-\infty}^{\infty} S_i(\omega) e^{i\omega(t_2 - t_1)} d\omega\right) \tilde{A}_0^{(i)}(t_1) \left(\tilde{A}_0^{(i)}(t_2)\right)^\dagger\right) \quad (63)$$

$$= \sum_{i=1}^{n} \frac{1}{D} \frac{1}{2\pi} \int_{-\infty}^{\infty} d\omega S_i(\omega) Tr\left(\int_0^\tau dt_1 \int_0^\tau dt_2 e^{i\omega t_2} e^{-i\omega t_1} \tilde{A}_0^{(i)}(t_1) \left(\tilde{A}_0^{(i)}(t_2)\right)^\dagger\right) \quad (64)$$

$$= \sum_{i=1}^{n} \frac{1}{D} \frac{1}{2\pi} \int_{-\infty}^{\infty} d\omega S_i(\omega) Tr\left(\left[\int_0^\tau dt_1 e^{-i\omega t_1} \tilde{A}_0^{(i)}(t_1)\right]\left[\int_0^\tau dt_2 e^{i\omega t_2} \left(\tilde{A}_0^{(i)}(t_2)\right)^\dagger\right]\right) \quad (65)$$

$$= \sum_{i=1}^{n} \frac{1}{D} \frac{1}{2\pi} \int_{-\infty}^{\infty} d\omega S_i(\omega) Tr\left(\left[\int_0^\tau dt_1 e^{-i\omega t_1} \tilde{A}_0^{(i)}(t_1)\right]\left[\int_0^\tau dt_2 e^{-i\omega t_2} \left(\tilde{A}_0^{(i)}(t_2)\right)^\dagger\right]\right) \quad (66)$$

Defining the Fourier transform of the operators $\tilde{A}_0^{(i)}(t)$ as $$\mathcal{F}[\tilde{A}_0^{(i)}] = \int_{-\infty}^{\infty} dt e^{-i\omega t} \tilde{A}_0^{(i)}(t) \quad (67)$$

we therefore obtain $$1 - \mathcal{F}_{av} = \sum_{i=1}^{n} \frac{1}{2\pi} \int_{-\infty}^{\infty} d\omega S_i(\omega) \frac{1}{D} Tr\left(\mathcal{F}[\tilde{A}_0^{(i)}] \mathcal{F}[\tilde{A}_0^{(i)}]^\dagger\right) \quad (68)$$

Thus we may finally express the infidelity as $$1 - \mathcal{F}_{av} = \sum_{i=1}^{n} \frac{1}{2\pi} \int_{-\infty}^{\infty} S_i(\omega) F_i(\omega) d\omega \quad (69)$$

where the filter functions $F_i(\omega)$ associated with each noise channel is defined by $$F_i(\omega) \equiv \frac{1}{D} Tr\left(\mathcal{F}[\tilde{A}_0^{(i)}] \mathcal{F}[\tilde{A}_0^{(i)}]^\dagger\right). \quad (70)$$

NOTE: the toggling frame noise axis operator is the control-transformed operator defining the noise axis, and therefore the Fourier transforms in Eq. (70) capture information about the control, relative to the noise channel of interest, but do not depend on any stochastic noise variables.

Since $$A^{(i)} = (A^{(i)})^\dagger \quad (71)$$

it follows $$(\tilde{A}_0^{(i)})' = (U_c)A^{(i)}U_c)^\dagger = (U_c)'(A^{(i)})^\dagger(U_c^\dagger)^\dagger = U_c^\dagger A^{(i)} U_c = \tilde{A}_0^{(i)} \quad (72)$$

Consequently, $$[(\tilde{A}_0^{(i)})^\dagger]_{jk} = [\tilde{A}_0^{(i)}]_{kj}^* \quad (73)$$

Now, applying Eq. (67) element wise, we therefore have $$\left[\mathcal{F}[\tilde{A}_0^{(i)}]^\dagger\right]_{jk} = \left[\int_{-\infty}^{\infty} dt e^{-i\omega t} \tilde{A}_0^{(i)}(t)\right]_{jk}^\dagger \quad (74)$$

-continued $$= \left[\int_{-\infty}^{\infty} dt e^{+i\omega t} \left(\tilde{A}_0^{(i)}(t)\right)^\dagger\right]_{jk} \quad (75)$$

$$= \left[\int_{-\infty}^{\infty} dt e^{+i\omega t} \left(\tilde{A}_0^{(i)}(t)\right)^\dagger\right]_{jk} \quad (76)$$

$$= \int_{-\infty}^{\infty} dt e^{+i\omega t} [\tilde{A}_0^{(i)}]_{jk}^* \quad (77)$$

$$= \left(\int_{-\infty}^{\infty} dt e^{-i\omega t} [\tilde{A}_0^{(i)}]_{kj}\right)^* \quad (78)$$

$$= \left[\mathcal{F}[\tilde{A}_0^{(i)}]\right]_{kj}^* \quad (79)$$

Therefore in (70)

$$\left[\mathcal{F}[\tilde{A}_0^{(i)}] \mathcal{F}[\tilde{A}_0^{(i)}]^\dagger\right]_{jk} = \sum_{q=1}^{D} \left[\mathcal{F}[\tilde{A}_0^{(i)}]\right]_{jq} \left[\mathcal{F}[\tilde{A}_0^{(i)}]^\dagger\right]_{qk} \quad (80)$$

$$= \sum_{q=1}^{D} \left[\mathcal{F}[\tilde{A}_0^{(i)}]\right]_{jq} \left[\mathcal{F}[\tilde{A}_0^{(i)}]\right]_{kq}^* \quad (81)$$

Therefore $$Tr\left[\mathcal{F}[\tilde{A}_0^{(i)}] \mathcal{F}[\tilde{A}_0^{(i)}]^\dagger\right] = \sum_{l=1}^{D} \left[\mathcal{F}[\tilde{A}_0^{(i)}] \mathcal{F}[\tilde{A}_0^{(i)}]^\dagger\right]_{ll} \quad (82)$$

$$= \sum_{l=1}^{D} \sum_{q=1}^{D} \left[\mathcal{F}[\tilde{A}_0^{(i)}]\right]_{lq} \left[\mathcal{F}[\tilde{A}_0^{(i)}]\right]_{lq}^* \quad (83)$$

$$= \sum_{l=1}^{D} \sum_{q=1}^{D} \left|\left[\mathcal{F}[\tilde{A}_0^{(i)}]\right]_{lq}\right|^2 \quad (84)$$

The filter function associated with the $i$ th noise channel therefore finally takes the form $$F_i(\omega) = \frac{1}{D} \sum_{l=1}^{D} \sum_{q=1}^{D} \left|\left[\mathcal{F}[\tilde{A}_0^{(i)}]\right]_{lq}\right|^2 \quad (85)$$

SUMMARY

We may therefore summarize as follows. For a quantum system of dimension D, let the Hamiltonian be written $$H(t)=H_c(t)+H_0(t) \quad (86)$$

where $H_c(t)$ describes perfect control, satisfying $$i\dot{U}_c(t,0)=H_c(t)U_c(t,0), \quad (87)$$

and the $H_0(t)$ captures the interaction with n independent noise channels, each modelled semi-classically as $$H_0(t) = \sum_{i=1}^{n} \beta_i(t)A^{(i)}(t) \quad (88)$$

where the noise fields $\beta_i(t)$ are assumed to be a classical zero-mean w.s.s. processes with associated PSD $S_i(\omega)$. Now, defining the toggling frame noise axis operators $$\tilde{A}_0^{(i)}(t) \equiv U_c^\dagger(t)A^{(i)}(t)U_c(t) \quad (89)$$

and the associated Fourier transforms $$\mathcal{F}[\tilde{A}_0^{(i)}(t)] \equiv \int_{-\infty}^{\infty} dt\, e^{-i\omega t} \tilde{A}_0^{(i)}(t) \quad (90)$$

we may express the operational infidelity, to first order, as $$1 - \mathcal{F}_{av} = \sum_{i=1}^{n} \frac{1}{2\pi} \int_{-\infty}^{\infty} S_i(\omega)F_i(\omega)d\omega \quad (91)$$

where the filter functions $F_i(\omega)$ associated with each noise channel are computed as $$F_i(\omega) = \frac{1}{D}\sum_{l=1}^{D}\sum_{q=1}^{D} |[\mathcal{F}[\tilde{A}_0^{(i)}(t)]]_{lq}|^2. \quad (92)$$

That is, take the Fourier transform of each element of the time-dependent operator $\tilde{A}_0^{(i)}(t)$, sum the complex modulus square of every element, and divide through by the dimension D of the quantum system. This result is appropriate for a general quantum system of Hilbert-space dimension D, which may be a multilevel "qudit" (A quantum unit of information that may take any of d states, where d is a variable), or multiple interacting qubits.

Decoherence in real driven systems is predominantly due to low-frequency correlated noise environments. This strongly motivates this disclosure of bounded-strength control as a noise filtering problem using time-dependent, non-Markovian error models, especially in the context of D-dimensional multiqubit or generic multilevel "qudit" systems. Moreover, the complications of treating bounded-strength control—due to the continual presence of noise interactions during control operations and the resulting nonlinear dynamics—can be addressed by the disclosed streamlined approach to the design of noise-filtering control for D dimensional systems.

The filter-transfer function framework described herein may take as input experimentally measurable characteristics of the environment—namely noise power spectra—and provides a numerically viable framework for both control construction and the calculation of predicted operational fidelities. It also efficiently captures the control nonlinearities implicit in situations where control and noise Hamiltonians do not commute. This framework is applicable to quantum systems beyond the original single-qubit systems studied, with modest assumptions about the form of noise axis operators describing the relevant noise channels in the system of interest.

The filter function presented in Eq. (85) may be implemented as a Python module for numeric computation of filter functions or in other programming languages including C++ and Java. The filter function has been tested against familiar cases where analytic forms are known, with good agreement confirmed over a frequency band limited by the sampling rate of the FFT used to numerically compute the Fourier transforms. Relevant example sample rates are 1,000 samples per operation, therefore ranging from approximately 1 ks/sec to 100 Gs/sec depending on the timescale of the relevant operation but not confined to this range.

Single-Qubit Examples

Single-Qubit Control with Single-Axis Amplitude Modulation

Consider a single qubit (D=2) system with control Hamiltonian $$H_c(t) = \frac{\Omega(t)}{2}\hat{\sigma}_x \quad (93)$$

e.g. using a Slepian modulation for $\Omega(t)$ to probe amplitude-modulated $\hat{\sigma}_x$ noise. Therefore the noise Hamiltonian takes the form $$H_0(t) = \beta_x(t)\frac{\Omega(t)}{2}\hat{\sigma}_x. \quad (94)$$

The noise axis operator therefore takes the form $$A^{(x)} = \frac{\Omega(t)}{2}\hat{\sigma}_x \quad (95)$$

so that the toggling frame noise axis operator is given by $$\tilde{A}_0^{(x)}(t) \equiv U_c^\dagger(t)A^{(x)}(t)U_c(t) = \frac{\Omega(t)}{2}\hat{\sigma}_x \quad (96)$$

since the control unitaries and noise axis operators commute for multiplicative amplitude noise. Consequently $$\mathcal{F}[\tilde{A}_0^{(i)}(t)] = \mathcal{F}\left[\frac{\Omega(t)}{2}\right]\hat{\sigma}_x = \frac{1}{2}\begin{bmatrix} 0 & \mathcal{F}[\Omega(t)] \\ \mathcal{F}[\Omega(t)] & 0 \end{bmatrix} \quad (97)$$

Therefore $$F_i(\omega) = \frac{1}{2}\sum_{l=1}^{2}\sum_{q=1}^{2}|[\mathcal{F}[\tilde{A}_0^{(i)}(t)]]_{lq}|^2 \quad (98)$$

-continued $$= \frac{1}{2}\left(\left|\frac{1}{2}\mathcal{F}[\Omega(t)]\right|^2 + \left|\frac{1}{2}\mathcal{F}[\Omega(t)]\right|^2\right) \quad (99)$$

$$= \frac{1}{2}\left(2\left|\mathcal{F}\left[\frac{\Omega(t)}{2}\right]\right|^2\right) \quad (100)$$

$$= \left|\mathcal{F}\left[\frac{\Omega(t)}{2}\right]\right|^2 \quad (101)$$

That is, the modulus square of the Fourier transform of the amplitude modulated envelope (e.g. a Slepian function).

Single-Qubit Dynamic Decoupling

Dynamic decoupling (DD) fits into the above description by requiring the control Hamiltonian to take the form of a series of instantaneous ("bang bang") operations. This can be phrased as a form of amplitude modulation, switching between values of zero (off) and infinite (on). The canonical DD scheme consists of a series n instantaneous π pulses around $\hat{\sigma}_x$, executed at times $\{t_j\}^{j=1}{}_n$ over the time interval $[0, \tau]$, where we define $t_0=0$ and $t_{n+1}=\tau$. We introduce the fractional time $\delta_j \in [0,1]$ defined by $t_j/\tau$ denoting the normalized pulse locations. In this case the sequence $$(\delta_1, \delta_2, \ldots, \delta_n)\tau \quad (102)$$

completely determines the DD structure and therefore its properties. Therefore the control Hamiltonian (D=2) takes the form $$H_c(t) = \frac{\Omega(t)}{2}\hat{\sigma}_x \quad (103)$$

where the amplitude modulation envelope Ω(t) takes values 0 or Ω, defining a train of n pulses centred at times $t_j$, each pulse having an area π and duration $\tau_j = \pi/\Omega$. In the bang-bang limit, $\tau_j \to 0$ and $\Omega \to \infty$. The control amplitude envelope may then be written as a Dirac comb:

$$\Omega(t) = \pi \sum_{j=1}^{n} \delta(t - t_j)\hat{\sigma}_x. \quad (104)$$

Therefore the control unitary takes the form $$U_c(t) = \exp\left[-i\frac{\pi}{2}\int_0^t dt' \sum_{j=1}^{n} \delta(t' - t_j)\hat{\sigma}_x\right] \quad (105)$$

$$= \exp\left[-i\sum_{j=1}^{n}\left(\frac{\pi}{2}\int_0^t dt'\delta(t' - t_j)\right)\hat{\sigma}_x\right] \quad (106)$$

$$= \exp\left[-i\frac{\pi}{2}\sum_{j=1}^{n}\Theta_j(t)\hat{\sigma}_x\right] \quad (107)$$

where the jth integral evaluates as $$\int_0^t dt'\delta(t' - t_j) = \Theta_j(t) \quad (108)$$

and Θ(t) is the Heaveside function defined as $$\Theta_j(t) \equiv \begin{cases} 0 & t < t_j \\ 1 & t \geq t_j \end{cases} \quad (109)$$

Therefore $$S(t) \equiv \sum_{j=1}^{n} \Theta_j(t) = \begin{cases} 0 & t_0 \leq t < t_1 \\ 1 & t_1 \leq t < t_2 \\ \ldots & \ldots \\ j & t_j \leq t < t_{j+1} \\ \ldots & \ldots \\ n & t_n \leq t < t_{n+1} \end{cases} \quad (110)$$

where S(t) counts the number of pulses that have been executed by time t.

Therefore, $$U_c(t) = \exp\left[-i\frac{\pi}{2}S(t)\hat{\sigma}_x\right] = \begin{cases} \hat{\mathbb{I}} & \text{for } S(t) \text{ even} \\ -i\hat{\sigma}_x & \text{for } S(t) \text{ odd} \end{cases} \quad (111)$$

In particular $$U_c(t) = \begin{cases} \hat{\mathbb{I}} & t_0 \leq t < t_1 \quad S(t) = 0 \\ \hat{\sigma}_x & t_1 \leq t < t_2 \quad S(t) = 1 \\ \hat{\mathbb{I}} & t_2 \leq t < t_3 \quad S(t) = 2 \\ \hat{\sigma}_x & t_3 \leq t < t_4 \quad S(t) = 3 \\ \ldots & \ldots \end{cases} \quad (112)$$

where the complex factor −i in front of $\hat{\sigma}_x$ has been ignored as this will only contributes a global phase. We may write this more compactly by introducing the square-wave (switching) function y(t), which takes values ±1, starting with y(0)=−1, such that the jth sign switch occurs at time $t_j$. That is $$y(t) = \begin{cases} -1 & t_0 \leq t < t_1 \quad S(t) = 0 \\ 1 & t_1 \leq t < t_2 \quad S(t) = 1 \\ -1 & t_2 \leq t < t_3 \quad S(t) = 2 \\ 1 & t_3 \leq t < t_4 \quad S(t) = 3 \\ \ldots & \ldots \end{cases} \quad (113)$$

Then we may write $$U_c(t) = \hat{\sigma}_x^{(y(t)+1)/2} \quad (114)$$

or alternatively $$U_c(t) = \frac{1 - y(t)}{2}\hat{\mathbb{I}} + \frac{1 + y(t)}{2}\hat{\sigma}_x \quad (115)$$

$$= \frac{y(t)}{2}(\hat{\sigma}_x - \hat{\mathbb{I}}) + \frac{1}{2}(\hat{\sigma}_x + \hat{\mathbb{I}}). \quad (116)$$

Now assuming dephasing $$H_0(t) = \beta_z(t)\hat{\sigma}_z \quad (117)$$

the noise operator therefore takes the form $$A^{(z)} = \hat{\sigma}_z \quad (118)$$

so that the toggling frame noise operator is given by $$\tilde{A}_0^{(z)}(t) = U_c^\dagger(t) A^{(z)}(t) U_c(t) \quad (119)$$

$$= \left(\frac{1-y(t)}{2}\hat{1} + \frac{1+y(t)}{2}\hat{\sigma}_x\right)\hat{\sigma}_z\left(\frac{1-y(t)}{2}\hat{1} + \frac{1+y(t)}{2}\hat{\sigma}_x\right) \quad (120)$$

$$= \begin{bmatrix} -y(t) & 0 \\ 0 & y(t) \end{bmatrix} \quad (121)$$

after expanding. Therefore in the Fourier domain we obtain $$\mathcal{F}[\tilde{A}_0^{(z)}(t)] = \begin{bmatrix} -Y(\omega) & 0 \\ 0 & Y(\omega) \end{bmatrix} \quad (122)$$

defining the Fourier transform of the switching function $$Y(\omega) = \mathcal{F}[y(t)] \quad (123)$$

The dephasing filter function is therefore given by $$F_z(\omega) = \frac{1}{2}\sum_{l=1}^{2}\sum_{q=1}^{2}\left|[\mathcal{F}[\tilde{A}_0^{(i)}(t)]]_{lq}\right|^2 \quad (124)$$

$$= \frac{1}{2}(|-Y(\omega)|^2 + |Y(\omega)|^2) \quad (125)$$

$$= |Y(\omega)|^2 \quad (126)$$

NOTE: this result is in fact independent of the sign convention of the switching function due to the fact that we are taking the modulus square in the end. That is, $|\mathcal{F}[y(t)]|^2 = |-\mathcal{F}[y(t)]|^2 = |\mathcal{F}[y(t)]|^2 = Y(\omega)$. Finally, we may write $$Y(\omega) = \sum_{j=0}^{n}\int_{t_j}^{t_{j+1}} y(t) e^{-i\omega t} dt \quad (127)$$

$$= \sum_{j=0}^{n}\int_{t_j}^{t_{j+1}} (-1)^j e^{-i\omega t} dt \quad (128)$$

$$= \sum_{j=0}^{n} (-1)^j \frac{1}{-i\omega}[e^{-i\omega t_{j+1}} - e^{-i\omega t_j}] \quad (129)$$

$$= \sum_{j=0}^{n} (-1)^j \frac{1}{i\omega}[e^{-i\delta_j \omega \tau} - e^{-i\delta_{j+1}\omega\tau}] \quad (130)$$

Yielding $$F_z(\omega) = \frac{1}{\omega^2}\left|\sum_{j=0}^{n}(-1)^j\left[e^{-i\delta_j\omega\tau} - e^{-i\delta_{j+1}\omega\tau}\right]\right|^2 \quad (131)$$

For example:
For a spin echo sequence, set $$n = 1, \text{ and } (\delta_0, \delta_1, \delta_2) = \left(0, \frac{1}{2}, 1\right),$$

then $$F_z(\omega) = \frac{1}{\omega^2}|[e^{-i\delta_0\omega\tau} - e^{-i\delta_1\omega\tau}] - [e^{-i\delta_1\omega\tau} - e^{-i\delta_2\omega\tau}]|^2 \quad (132)$$

$$= \frac{1}{\omega^2}|[1 - e^{-i\omega\tau/2}] - [e^{-i\omega\tau/2} - e^{-i\omega\tau}]|^2 \quad (133)$$

$$= \frac{1}{\omega^2}|[1 - 2e^{-i\omega\tau/2} + e^{-i\omega\tau}]|^2 \quad (134)$$

$$= 16\sin^4\left[\frac{\omega\tau}{4}\right]/\omega^2 \quad (135)$$

Two-Qubit Gate Examples

The following description sets out some results for filter function analysis for two-qubit gates using the formalism set out above.

Representation

We define the following single- and two-qubit operator conventions as follows

Single qubit $$|1\rangle = \begin{bmatrix} 1 \\ 0 \end{bmatrix}, |0\rangle = \begin{bmatrix} 0 \\ 1 \end{bmatrix} \quad (201)$$

$$\hat{1}_1 = \begin{bmatrix} 1 & 0 \\ 0 & 1 \end{bmatrix}, \hat{\sigma}_x = \begin{bmatrix} 0 & 1 \\ 1 & 0 \end{bmatrix}, \hat{\sigma}_y = \begin{bmatrix} 0 & -i \\ i & 0 \end{bmatrix}, \hat{\sigma}_z = \begin{bmatrix} 1 & 0 \\ 0 & -1 \end{bmatrix} \quad (202)$$

with commutation relations $$[\hat{\sigma}_x, \hat{\sigma}_y] = 2i\hat{\sigma}_z \quad (203)$$

$$[\hat{\sigma}_y, \hat{\sigma}_z] = 2i\hat{\sigma}_x \quad (204)$$

$$[\hat{\sigma}_z, \hat{\sigma}_x] = 2i\hat{\sigma}_y \quad (205)$$

$$[\hat{\sigma}_y, \hat{\sigma}_x] = -2i\hat{\sigma}_z \quad (206)$$

$$[\hat{\sigma}_z, \hat{\sigma}_y] = -2i\hat{\sigma}_x \quad (207)$$

$$[\hat{\sigma}_x, \hat{\sigma}_z] = -2i\hat{\sigma}_y \quad (208)$$

Two qubit

With the definitions provided below with reference to tensor products we write the two-qubit states $$|11\rangle \equiv |1\rangle \otimes |1\rangle = \begin{bmatrix} 1 \\ 0 \\ 0 \\ 0 \end{bmatrix} \quad (209)$$

$$|10\rangle \equiv |1\rangle \otimes |0\rangle = \begin{bmatrix} 0 \\ 1 \\ 0 \\ 0 \end{bmatrix} \quad (210)$$

-continued $$|01\rangle \equiv |0\rangle \otimes |1\rangle = \begin{bmatrix} 0 \\ 0 \\ 1 \\ 0 \end{bmatrix} \quad (211)$$

$$|00\rangle \equiv |0\rangle \otimes |0\rangle = \begin{bmatrix} 0 \\ 0 \\ 0 \\ 1 \end{bmatrix} \quad (212)$$

and operators $$\hat{\mathbb{1}}_2 \equiv \hat{\mathbb{1}}_1 \otimes \hat{\mathbb{1}}_1 = \begin{bmatrix} \hat{\mathbb{1}}_1 & 0 \\ 0 & \hat{\mathbb{1}}_1 \end{bmatrix} = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad (213)$$

$$\hat{I}X \equiv \hat{\mathbb{1}}_1 \otimes \hat{\sigma}_x = \begin{bmatrix} \hat{\sigma}_x & 0 \\ 0 & \hat{\sigma}_x \end{bmatrix} = \begin{bmatrix} 0 & 1 & 0 & 0 \\ 1 & 0 & 0 & 0 \\ 0 & 0 & 0 & 1 \\ 0 & 0 & 1 & 0 \end{bmatrix} \quad (214)$$

$$\hat{I}Y \equiv \hat{\mathbb{1}}_1 \otimes \hat{\sigma}_y = \begin{bmatrix} \hat{\sigma}_y & 0 \\ 0 & \hat{\sigma}_y \end{bmatrix} = \begin{bmatrix} 0 & -i & 0 & 0 \\ i & 0 & 0 & 0 \\ 0 & 0 & 0 & -i \\ 0 & 0 & i & 0 \end{bmatrix} \quad (215)$$

$$\vdots \quad (216)$$

$$\hat{X}X \equiv \hat{\sigma}_x \otimes \hat{\sigma}_x = \begin{bmatrix} 0 & \hat{\sigma}_x \\ \hat{\sigma}_x & 0 \end{bmatrix} = \begin{bmatrix} 0 & 0 & 0 & 1 \\ 0 & 0 & 1 & 0 \\ 0 & 1 & 0 & 0 \\ 1 & 0 & 0 & 0 \end{bmatrix} \quad (217)$$

$$\vdots \quad (218)$$

$$\hat{X}Z \equiv \hat{\sigma}_z \otimes \hat{\sigma}_y = \begin{bmatrix} 0 & \hat{\sigma}_z \\ \hat{\sigma}_z & 0 \end{bmatrix} = \begin{bmatrix} 0 & 0 & 1 & 0 \\ 0 & 0 & 0 & -1 \\ 1 & 0 & 0 & 0 \\ 0 & -1 & 0 & 0 \end{bmatrix} \quad (219)$$

$$\vdots \quad (220)$$

$$\hat{Z}Y \equiv \hat{\sigma}_z \otimes \hat{\sigma}_y = \begin{bmatrix} \hat{\sigma}_y & 0 \\ 0 & -\hat{\sigma}_y \end{bmatrix} = \begin{bmatrix} 0 & -i & 0 & 0 \\ i & 0 & 0 & 0 \\ 0 & 0 & 0 & i \\ 0 & 0 & -i & 0 \end{bmatrix} \quad (221)$$

$$\hat{Z}Z \equiv \hat{\sigma}_z \otimes \hat{\sigma}_z = \begin{bmatrix} \hat{\sigma}_z & 0 \\ 0 & -\hat{\sigma}_z \end{bmatrix} = \begin{bmatrix} 1 & 0 & 0 & 0 \\ 0 & -1 & 0 & 0 \\ 0 & 0 & -1 & 0 \\ 0 & 0 & 0 & 1 \end{bmatrix} \quad (222)$$

Two-qubit commutators

The commutators for all two-qubit operators is shown in the matrix in Eq. (224). The margins on the left and top display all 16 two-qubit operators, indexed from 1 to 16 down the rows and across the columns. The (i,j)th matrix element is defined as the commutator of the ith listed operator (left margin) with the jth listed operator (top margin). For example, index 16 corresponds to ZZ and index 2 corresponds $\hat{I}X$. Matrix element (16,2) displays $2i\hat{Z}Y$ (the prefactor comes from multiplying the entire matrix by 2i). That is, $$[\hat{Z}Z, \hat{I}X] = 2i\hat{Z}Y \quad (223)$$

| | $\hat{I}I$ | $\hat{I}X$ | $\hat{I}Y$ | $\hat{I}Z$ | $\hat{X}I$ | $\hat{X}X$ | $\hat{X}Y$ | $\hat{X}Z$ | $\hat{Y}I$ | $\hat{Y}X$ | $\hat{Y}Y$ | $\hat{Y}Z$ | $\hat{Z}I$ | $\hat{Z}X$ | $\hat{Z}Y$ | $\hat{Z}Z$ |
|---|---|---|---|---|---|---|---|---|---|---|---|---|---|---|---|---|
| $\hat{I}I$ | 0 | 0 | 0 | 0 | 0 | 0 | 0 | 0 | 0 | 0 | 0 | 0 | 0 | 0 | 0 | 0 |
| $\hat{I}X$ | 0 | 0 | $\hat{I}Z$ | $-\hat{I}Y$ | 0 | 0 | $\hat{X}Z$ | $-\hat{X}Y$ | 0 | 0 | $\hat{Y}Z$ | $-\hat{Y}Y$ | 0 | 0 | $\hat{Z}Z$ | $-\hat{Z}Y$ |
| $\hat{I}Y$ | 0 | $-\hat{I}Z$ | 0 | $\hat{I}X$ | 0 | $-\hat{X}Z$ | 0 | $\hat{X}X$ | 0 | $-\hat{Y}Z$ | 0 | $\hat{Y}X$ | 0 | $-\hat{Z}Z$ | 0 | $\hat{Z}X$ |
| $\hat{I}Z$ | 0 | $\hat{I}Y$ | $-\hat{I}X$ | 0 | 0 | $\hat{X}Y$ | $-\hat{X}X$ | 0 | 0 | $\hat{Y}Y$ | $-\hat{Y}X$ | 0 | 0 | $\hat{Z}Y$ | $-\hat{Z}X$ | 0 |
| $\hat{X}I$ | 0 | 0 | 0 | 0 | 0 | 0 | 0 | 0 | $\hat{Z}I$ | $\hat{Z}X$ | $\hat{Z}Y$ | $\hat{Z}Z$ | $-\hat{Y}I$ | $-\hat{Y}X$ | $-\hat{Y}Y$ | $-\hat{Y}Z$ |
| $\hat{X}X$ | 0 | 0 | $\hat{X}Z$ | $-\hat{X}Y$ | 0 | 0 | $\hat{I}Z$ | $-\hat{I}Y$ | $\hat{Z}X$ | $\hat{Z}I$ | 0 | 0 | $-\hat{Y}X$ | $-\hat{Y}I$ | 0 | 0 |
| $\hat{X}Y$ | 0 | $-\hat{X}Z$ | 0 | $\hat{X}X$ | 0 | $-\hat{I}Z$ | 0 | $\hat{I}X$ | $\hat{Z}Y$ | 0 | $\hat{Z}I$ | 0 | $-\hat{Y}Y$ | 0 | $-\hat{Y}I$ | 0 |
| $\hat{X}Z$ | 0 | $\hat{X}Y$ | $-\hat{X}X$ | 0 | 0 | $\hat{I}Y$ | $-\hat{I}X$ | 0 | $\hat{Z}Z$ | 0 | 0 | $\hat{Z}I$ | $-\hat{Y}Z$ | 0 | 0 | $-\hat{Y}I$ |
| $\hat{Y}I$ | 0 | 0 | 0 | 0 | $-\hat{Z}I$ | $-\hat{Z}X$ | $-\hat{Z}Y$ | $-\hat{Z}Z$ | 0 | 0 | 0 | 0 | $\hat{X}I$ | $\hat{X}X$ | $\hat{X}Y$ | $\hat{X}Z$ |
| $\hat{Y}X$ | 0 | 0 | $\hat{Y}Z$ | $-\hat{Y}Y$ | $-\hat{Z}X$ | $-\hat{Z}I$ | 0 | 0 | 0 | 0 | $\hat{I}Z$ | $-\hat{I}Y$ | $\hat{X}X$ | $\hat{X}I$ | 0 | 0 |
| $\hat{Y}Y$ | 0 | $-\hat{Y}Z$ | 0 | $\hat{Y}X$ | $-\hat{Z}Y$ | 0 | $-\hat{Z}I$ | 0 | 0 | $-\hat{I}Z$ | 0 | $\hat{I}X$ | $\hat{X}Y$ | 0 | $\hat{X}I$ | 0 |
| $\hat{Y}Z$ | 0 | $\hat{Y}Y$ | $-\hat{Y}X$ | 0 | $-\hat{Z}Z$ | 0 | 0 | $-\hat{Z}I$ | 0 | $\hat{I}Y$ | $-\hat{I}X$ | 0 | $\hat{X}Z$ | 0 | 0 | $\hat{X}I$ |
| $\hat{Z}I$ | 0 | 0 | 0 | 0 | $\hat{Y}I$ | $\hat{Y}X$ | $\hat{Y}Y$ | $\hat{Y}Z$ | $-\hat{X}I$ | $-\hat{X}X$ | $-\hat{X}Y$ | $-\hat{X}Z$ | 0 | 0 | 0 | 0 |
| $\hat{Z}X$ | 0 | 0 | $\hat{Z}Z$ | $-\hat{Z}Y$ | $\hat{Y}X$ | $\hat{Y}I$ | 0 | 0 | $-\hat{X}X$ | $-\hat{X}I$ | 0 | 0 | 0 | 0 | $\hat{I}Z$ | $-\hat{I}Y$ |
| $\hat{Z}Y$ | 0 | $-\hat{Z}Z$ | 0 | $\hat{Z}X$ | $\hat{Y}Y$ | 0 | $\hat{Y}I$ | 0 | $-\hat{X}Y$ | 0 | $-\hat{X}I$ | 0 | 0 | $-\hat{I}Z$ | 0 | $\hat{I}X$ |
| $\hat{Z}Z$ | 0 | $\hat{Z}Y$ | $-\hat{Z}X$ | 0 | $\hat{Y}Z$ | 0 | 0 | $\hat{Y}I$ | $-\hat{X}Z$ | 0 | 0 | $-\hat{X}I$ | 0 | $\hat{I}Y$ | $-\hat{I}X$ | 0 |

$\times 2i$ (2.24)

These commutators may be derived using Eq. (406). For example, $$[\hat{Z}Z, \hat{I}X] = (\hat{Z}Z)(\hat{I}X) - (\hat{I}X)(\hat{Z}Z) \tag{225}$$

$$= (\hat{\sigma}_z \otimes \hat{\sigma}_z)(\hat{\mathbb{1}}_2 \otimes \hat{\sigma}_x) - (\hat{\mathbb{1}}_2 \otimes \hat{\sigma}_x)(\hat{\sigma}_z \otimes \hat{\sigma}_z) \tag{226}$$

$$= (\hat{\sigma}_z \hat{\mathbb{1}}_2) \otimes (\hat{\sigma}_z \hat{\sigma}_x) - (\hat{\mathbb{1}}_2 \hat{\sigma}_z) \otimes (\hat{\sigma}_x \hat{\sigma}_z) \tag{227}$$

$$= \hat{\sigma}_z \otimes (i\hat{\sigma}_y) - (\hat{\sigma}_z) \otimes (-i\hat{\sigma}_y) \tag{228}$$

$$= i\hat{Z}Y + i\hat{Z}Y \tag{229}$$

$$= 2i\hat{Z}Y \tag{230}$$

We are interested in examining subspaces of the 16-element operator space possessing commutator relations sharing the structure of the commutator relationships of the single-qubit Pauli operators. Working in these subspaces provides a path towards mapping familiar single-qubit controls to two-qubit systems. Below consider two such subspaces of interest, due to their including the two-qubit interaction terms $\hat{Z}Z$ and $\hat{X}X$ which may be engineered in physical systems.

Effective compensating pulses: $\hat{Z}\hat{Z}$ subspace
Consider the two-qubit control Hamiltonian $$H_c = \alpha_{zz}(t)\hat{Z}Z + \alpha_{ix}(t)\hat{I}X + \alpha_{zy}(t)\hat{Z}Y \tag{231}$$

mapping to the effective single qubit Hamiltonian $$H_c = \frac{1}{2}\left(\Omega_x(t)\hat{S}_x + \Omega_y(t)\hat{S}_y + \Omega_z(t)\hat{S}_z\right) \tag{232}$$

where the effective operators are defined as $$\hat{S}_x = \hat{Z}Z, \hat{S}_y = \hat{I}X, \hat{S}_z = \hat{Z}Y \tag{233}$$

and the control amplitudes are defined as $$\alpha_{zz} = \frac{\Omega_x}{2}, \alpha_{ix} = \frac{\Omega_y}{2}, \alpha_{zy} = \frac{\Omega_z}{2} \tag{234}$$

Then using Eq. (406) or reading of the table in Eq. (224), we obtain the following commutation relations $$[\hat{S}_x, \hat{S}_y] = 2i\hat{S}_z \tag{235}$$

$$[\hat{S}_y, \hat{S}_z] = 2i\hat{S}_x \tag{236}$$

$$[\hat{S}_z, \hat{S}_x] = 2i\hat{S}_y \tag{237}$$

$$[\hat{S}_y, \hat{S}_x] = -2i\hat{S}_z \tag{238}$$

$$[\hat{S}_z, \hat{S}_y] = -2i\hat{S}_x \tag{239}$$

$$[\hat{S}_x, \hat{S}_z] = -2i\hat{S}_y \tag{240}$$

Since the $\hat{S}_i$ satisfy the commutation relations for Pauli operators, Eq. (232) is equivalent to a single-qubit Hamiltonian, so we may implement any of the control techniques known to work in that space. That is, any controls known to have compensating properties in the single-qubit basis $\{\hat{\sigma}_x, \hat{\sigma}_y, \hat{\sigma}_z\}$ should map to two-qubit systems, with controls (and noise) spanned by this basis $\{\hat{S}_x, \hat{S}_y, \hat{S}_z\}$. We consider two cases below, and show the corresponding filter functions, showing agreement with expected performance.

Effective primitive $\pi_x$
For an interaction time $\tau$, set $$\Omega_x = \frac{\pi}{\tau}, \Omega_y = 0, \Omega_z = 0. \tag{241}$$

This resembles a primitive $\pi$ pulse around the single-qubit $\hat{S}_x$ axis, but in the two-qubit space maps to accumulating a $\pi$ phase on the $\hat{Z}Z$ interaction term. One expects filter function for this operation in the two-qubit space to inherit the same properties (i.e. filter order) as the primitive single-qubit $\pi_x$ pulse.

Effective BB1-protected $\pi_x$ in multiqubit subspace for ZZ interactions

In one example, we can achieve noise-filtering multiqubit logic operations by crafting controls inspired by single-qubit techniques, but now operating in the noise filtering framework described in this disclosure for multiqubit operations. We can now implement the 4-segment BB1 pulse to achieve the same effective operation on $\hat{S}_x = \hat{Z}Z$ with augmented noise-filtering properties. Let $\hat{R}(\theta,\phi)$ denote a rotation of the Bloch vector about the $\hat{S}_x \cos(\phi) + \hat{S}_y \sin(\phi)$ axis, through an angle $\theta$. Then the BB1 pulse implementing a net $\theta$ rotation about $\hat{S}_x$ is written (operators applied from right to left)

$$BB1(\theta) = \hat{R}(\pi,\phi_{BB1})\hat{R}(2\pi,3\phi_{BB1})\hat{R}(\pi,\phi_{BB1})\hat{R}(\pi,0) \tag{242}$$

where $$\phi_{BB1} = \cos^{-1}\left(-\frac{\theta}{4\pi}\right) \tag{243}$$

implemented with constant Rabi rate $\Omega_0$ over a series of segments with durations $\tau_l$, $l \in \{1, \ldots, 4\}$, this is written $$BB1(\theta) = \begin{array}{c} \\ P_1 \\ P_2 \\ P_3 \\ P_4 \end{array} \begin{bmatrix} \Omega_x & \Omega_y & \Omega_z & \tau_l \\ \Omega_0\cos(0) & \Omega_0\sin(0) & 0 & \frac{\theta}{\Omega_0} \\ \Omega_0\cos(\phi_{BB1}) & \Omega_0\sin(\phi_{BB1}) & 0 & \frac{\pi}{\Omega_0} \\ \Omega_0\cos(3\phi_{BB1}) & \Omega_0\sin(3\phi_{BB1}) & 0 & \frac{2\pi}{\Omega_0} \\ \Omega_0\cos(\phi_{BB1}) & \Omega_0\sin(\phi_{BB1}) & 0 & \frac{\pi}{\Omega_0} \end{bmatrix}. \tag{244}$$

Figure 5:
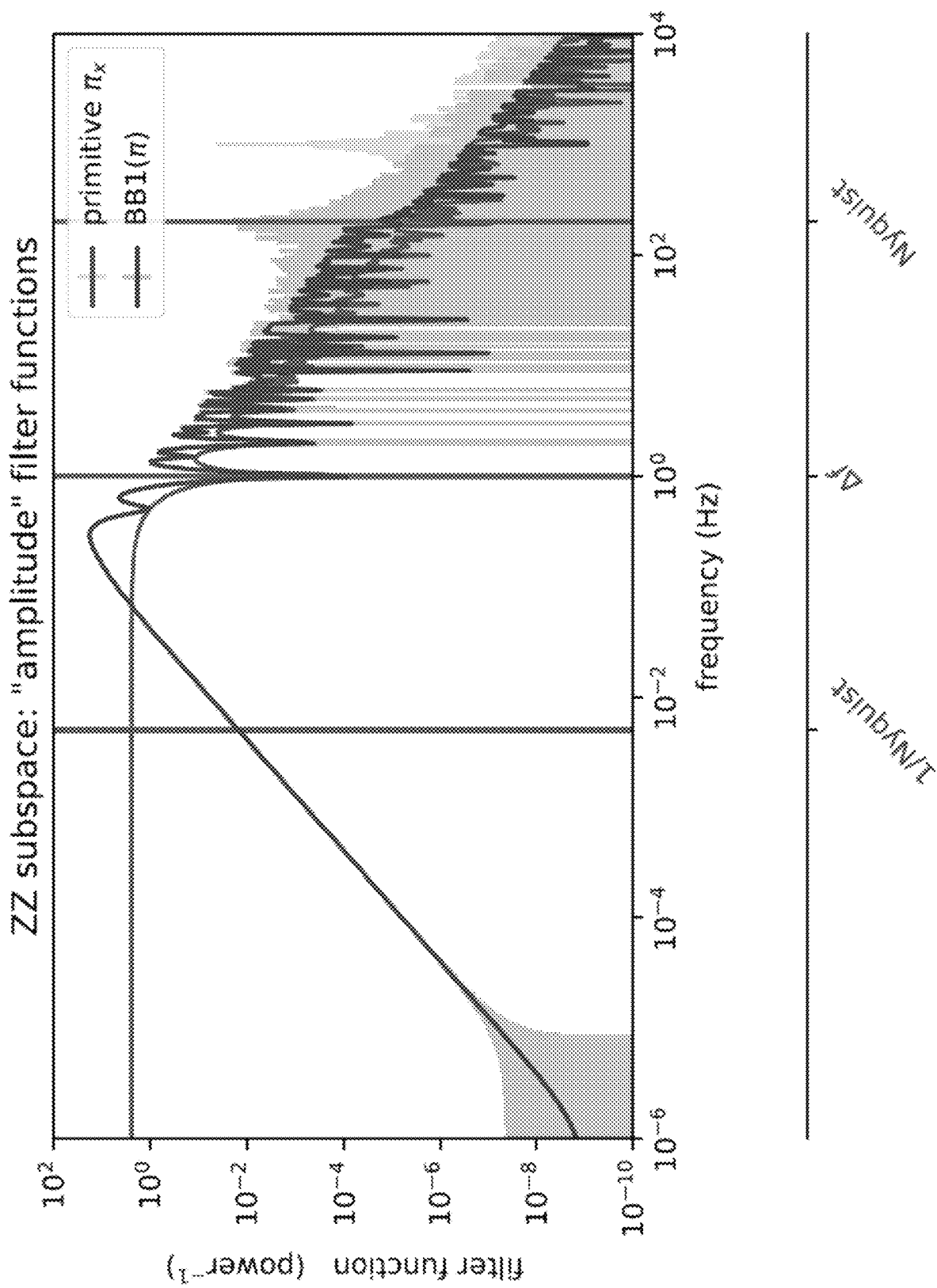
FIG. 5 illustrates filter functions for a two-qubit system.

FIG. 5 illustrates filter functions for a two-qubit system, comparing effective primitive $\pi_x$ and effective BB1($\pi$) implemented in the $\hat{Z}Z$ subspace. BB1 exhibits higher filter order than primitive.

The BB1($\pi$) pulse achieves the same net operation as the primitive $\pi$ pulse, but compensates for errors in the amplitude (Rabi rate). That is, the amplitude filter function for BB1($\pi$) should exhibit higher filter order than the primitive, for a noise operator proportional to the control. Here amplitude noise means common $\hat{S}_x$, $\hat{S}_y$ noise. In the two-qubit picture this implies common noise on controls $\hat{Z}Z$ and $\hat{I}X$. FIG. 5 demonstrates this result. It is in general a challenge to calculate this filtering behavior, absent the disclosed method.

Effective compensating pulses: $\hat{X}\hat{X}$ interactions
Consider the two-qubit control Hamiltonian $$H_c = \alpha_{xx}(t)\hat{X}X + \alpha_{iy}(t)\hat{I}Y + \alpha_{xz}(t)\hat{X}Z \tag{245}$$

mapping to the effective single qubit Hamiltonian $$H_c = \frac{1}{2}(\Omega_x(t)\hat{S}_x + \Omega_y(t)\hat{S}_y + \Omega_z(t)\hat{S}_z) \tag{246}$$

where the effective operators $\hat{S}_i$ are defined as $$\hat{S}_x = \hat{X}X, \ \hat{S}_y = \hat{I}Y, \ \hat{S}_z = \hat{X}Z \tag{247}$$

and the control amplitudes are defined as $$\alpha_{xx} = \frac{\Omega_x}{2}, \ \alpha_{iy} = \frac{\Omega_y}{2}, \ \alpha_{xz} = \frac{\Omega_z}{2} \tag{248}$$

Then using Eq. (406) below or reading of the table in Eq. (224), we obtain the following commutation relations $$[\hat{S}_x, \hat{S}_y] = 2i\hat{S}_z \tag{249}$$

$$[\hat{S}_y, \hat{S}_z] = 2i\hat{S}_x \tag{250}$$

$$[\hat{S}_z, \hat{S}_x] = 2i\hat{S}_y \tag{251}$$

$$[\hat{S}_y, \hat{S}_z] = -2i\hat{S}_x \tag{252}$$

$$[\hat{S}_z, \hat{S}_y] = -2i\hat{S}_x \tag{253}$$

$$[\hat{S}_x, \hat{S}_z] = -2i\hat{S}_y \tag{254}$$

Since the $\hat{S}_i$ satisfy the commutation relations for Pauli operators, Eq. (246) is equivalent to a single-qubit Hamiltonian, so we may implement any of the control techniques known to work in that space. That is, any controls known to have compensating properties in the single-qubit basis $\{\hat{\sigma}_x, \hat{\sigma}_y, \hat{\sigma}_z\}$ should map to two-qubit systems, with controls (and noise) spanned by this basis $\{\hat{S}_x, \hat{S}_y, \hat{S}_z\}$. We consider two cases below, and show the corresponding filter functions, showing agreement with expected performance. Again, we consider two cases below, and show the corresponding filter functions, showing agreement with expected performance.

Effective primitive $\pi_x$
For an interaction time $\tau$, set $$\Omega_x = \frac{\pi}{\tau}, \ \Omega_y = 0, \ \Omega_z = 0. \tag{255}$$

This resembles a primitive $\pi$ pulse around the single-qubit $\hat{S}_x$ axis, but in the two-qubit space maps to accumulating a $\pi$ phase on the $\hat{X}X$ interaction term. One expects filter function for this operation in the two-qubit space to inherit the same properties (i.e. filter order) as the primitive single-qubit $\pi_x$ pulse.

Effective BB1-protected $\pi_x$ in multiqubit subspace for XX interactions

In another example we can also implement the 4-segment BB1 pulse to achieve the same effective operation on $\hat{S}_x = \hat{X}X$ with augmented noise filtering properties. Let $\hat{R}(\theta, \phi)$ denote a rotation of the Bloch vector about the $\hat{S}_x \cos(\phi) + \hat{S}_y \sin(\phi)$ axis, through an angle $\theta$. Then the BB1 pulse implementing a net $\theta$ rotation about $\hat{S}_x$ is written (operators applied from right to left)

$$BB1(\theta) = \hat{R}(\pi, \phi_{BB1})\hat{R}(2\pi, 3\phi_{BB1})\hat{R}(\pi, \phi_{BB1})\hat{R}(\pi, 0) \tag{256}$$

where $$\phi_{BB1} = \cos^{-1}\left(-\frac{\theta}{4\pi}\right) \tag{257}$$

implemented with constant Rabi rate $\Omega_0$ over as a series of segments with durations $\tau_l$, $l \in \{1, \ldots, 4\}$, this is written $$BB1(\theta) = \begin{array}{c} \\ P_1 \\ P_2 \\ P_3 \\ P_4 \end{array} \begin{bmatrix} \Omega_x & \Omega_y & \Omega_z & \tau_l \\ \Omega_0\cos(0) & \Omega_0\sin(0) & 0 & \frac{\theta}{\Omega_0} \\ \Omega_0\cos(\phi_{BB1}) & \Omega_0\sin(\phi_{BB1}) & 0 & \frac{\pi}{\Omega_0} \\ \Omega_0\cos(3\phi_{BB1}) & \Omega_0\sin(3\phi_{BB1}) & 0 & \frac{2\pi}{\Omega_0} \\ \Omega_0\cos(\phi_{BB1}) & \Omega_0\sin(\phi_{BB1}) & 0 & \frac{\pi}{\Omega_0} \end{bmatrix}. \tag{258}$$

Figure 6:
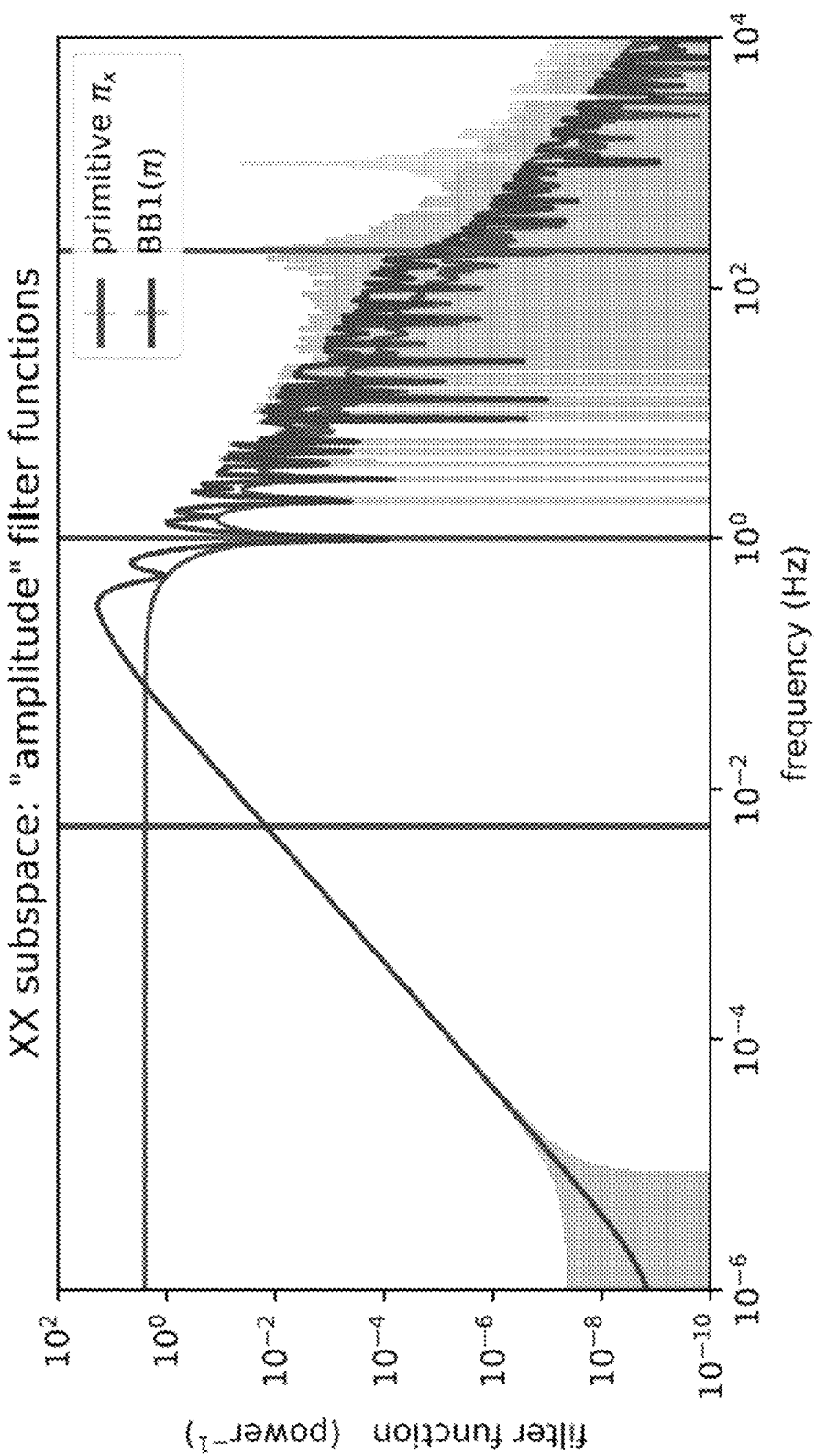
FIG. 6 illustrates filter functions for a two-qubit system.

FIG. 6 illustrates filter functions for a two-qubit system, comparing effective primitive $\pi_x$ and effective BB1($\pi$) implemented in the $\hat{X}X$ subspace. BB1 exhibits higher filter order than primitive.

The BB1($\pi$) pulse achieves the same net operation as the primitive $\pi$ pulse, but compensates for errors in the amplitude (Rabi rate). That is, the amplitude filter function for BB1($\pi$) should exhibit higher filter order than the primitive, for a noise operator proportional to the control. Here amplitude noise means common $\hat{S}_x, \hat{S}_y$ noise. In the two-qubit picture this implies common noise on controls $\hat{X}X$ and $\hat{I}Y$. FIG. 6 demonstrates this result, as calculated using the filter functions which are the subject of this disclosure.

Mathematical Preliminaries

The following description provides mathematical formulations used above.

Tensor product

Definition 1.1 If A is a m×n matrix and B is a p×q matrix, define the Kronecker product A⊗B as $$A \otimes B = \begin{Bmatrix} a_{1,1}B & \ldots & a_{1,n}B \\ \vdots & \ddots & \vdots \\ a_{m,1}B & \ldots & a_{m,n}B \end{Bmatrix} \tag{401}$$

yielding the mp×nq matrix.
Then the following properties hold
Property 1.1 Define matrices $$A(m \times n) \tag{402}$$

$$B(p \times q) \tag{403}$$

$$C(n \times r) \tag{404}$$

$$D(q \times s) \tag{405}$$

then $$(A \otimes B)(C \otimes D) = (AC) \otimes (BD) \tag{406}$$

In particular

Property 1.2 Let $\vec{u}$ be a m×1 column vector and $\vec{v}$ be p×1 column vector, then the Kronecker product results in the (mp×1) column vector $$\vec{u} \otimes \vec{v} = \begin{bmatrix} u_1 \vec{v} \\ \vdots \\ u_m \vec{v} \end{bmatrix} = \begin{bmatrix} u_1 v_1 \\ u_1 v_2 \\ \vdots \\ u_m v_{p-1} \\ u_m v_p \end{bmatrix} \quad (407)$$

$$(A \otimes B)(\vec{u} \otimes \vec{v}) = (A\vec{u}) \otimes (B\vec{v}) \quad (408)$$

Rephrasing using quantum mechanical kets and operators,

Property 1.3 Let $\mathcal{H}_m$ and $\mathcal{H}_p$ be m- and p-dimensional Hilbert spaces, on which we define operators $$A \in \mathcal{H}_m, B \in \mathcal{H}_p \quad (409)$$

and kets $$|u\rangle, A\beta u \rangle \in \mathcal{H}_m, |v\rangle, B|v\rangle \in \mathcal{H}_p \quad (410)$$

Then $$|uv\rangle \equiv |u\rangle \otimes |v\rangle \in \mathcal{H}_{mp}, A \otimes B \in \mathcal{H}_{mp} \quad (411)$$

are a ket and operator on the joint Hilbert space $\mathcal{H}_{mp} = \mathcal{H} \otimes \mathcal{H}_p$ such that $$(A \otimes B)(|u\rangle \otimes |v\rangle) = A|u\rangle \otimes B|v\rangle \quad (412)$$

We define the outer product

Definition 1.2 Let $|u\rangle, |v\rangle \in \mathcal{H}$ be kets on the same Hilbert space. Then the outer product $$uv \equiv (|u\rangle)^\dagger \otimes |v\rangle \quad (413)$$

defined an operator on $\mathcal{H}$

Then the following property holds

Property 1.4 Let $|a\rangle, |b\rangle, |c\rangle, |d\rangle \in \mathcal{H}$ be kets on the same Hilbert space and define the operators $$ab, cd \in \mathcal{H} \quad (414)$$

Then the operator $ab \otimes cd \in \mathcal{H} \otimes \mathcal{H}$ defined on the joint Hilbert space satisfies $$ab \otimes cd = acbd \quad (415)$$

where $$|ac\rangle = |a\rangle \otimes |b\rangle \in \mathcal{H} \otimes \mathcal{H} |bd\rangle = |b\rangle |d\rangle \in \mathcal{H} \otimes \mathcal{H} \quad (416)$$

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

REFERENCES

[1] Biercuk, M. J., Uys, H., VanDevender, A. P., Shiga, N., Itano, W. M., and Bollinger, J. J. (2009a). High-fidelity quantum control using ion crystals in a Penning trap. Quantum Information and Computation, 9:920-949.

[2] Bylander, J., Gustavsson, S., Yan, F., Yoshihara, F., Harrabi, K., Fitch, G., Cory, D. G., Nakamura, Y., Tsai, J.-S., and Oliver, W. D. (2011). Noise spectroscopy through dynamical decoupling with a superconducting flux qubit. Nat. Phys., 7:565-570.

[3] Faoro, L. and Viola, L. (2004). Dynamical suppression of noise processes in qubit systems. Phys. Rev. Lett., 92:117905.

[4] Harlingen, D. J. V., Plourde, B. L. T., Robertson, T. L., Reichardt, P. A., and Clarke, J. (2004). Decoherence in flux qubits due to 1/f noise in Josephson junctions. In Leggett, A., Ruggiero, B., and Silvestini, P., editors, Quantum Computing and Quantum Bits in Mesoscopic Systems, pages 171-184. Kluwer Academic Press, New York.

[5] Zhang, W., Dobrovitski, V. V., Santos, L. F., Viola, L., and Harmon, B. N. (2007). Dynamical control of electron spin coherence in a quantum dot: a theoretical study. Phys. Rev. B, 75:201302.

[6] Rutman, J. (1978). Characterization of phase and frequency instabilities in precision frequency sources: fifteen years of progress. Proceedings of the IEEE, 66:1048.

[7] Green, T. J., Sastrawan, J., Uys, H., and Biercuk, M. J. (2013). Arbitrary quantum control of qubits in the presence of universal noise. New J. Phys., 15:095004.

[8] Miller, S. L. and Childers, D. (2012). Probability and Random Processes with Applications to Signal Processing and Communications. Academic Press, Boston, Mass.

[9] Schumacher, B. (1996). Sending entanglement through noisy quantum channels. Phys. Rev. A, 54:2614.

[10] Blanes, S., Cases, F., Oteo, J. A., and Ros, J. (2009). The Magnus expansion and some of its applications. Phys. Rep., 470:151.

[11] Magnus, W. (1954). On the exponential solution of differential equations for a linear operator. Commun. Pure and Appl. Math., 7:649.

[12] Harmuth, H. F. (1969a). Applications of Walsh functions in communications. IEEE Spectrum, 6:82.

[13] Ball, H. and Biercuk, M. J. (2015). Walsh-synthesized noise filters for quantum logic. EPJ Quantum Technol., 2(1).

The invention claimed is:

1. A method for evaluating and improving performance of a control implementation on a quantum processor comprising multiple qubits in the presence of noise, the method comprising:
    modelling the noise by decomposing noise interactions described by a multi-qubit noise Hamiltonian into multiple contributory noise channels, each channel generating noise dynamics described by a unique noise-axis operator $A^{\{(i)\}}$, where (i) indexes the ith noise channel;
    determining, for a given control implementation, the unique filter function for each noise channel representing susceptibility of the multi-qubit system to the associated noise dynamics, each of the multiple filter functions being based on a frequency transformation ($\mathcal{F}$) of the noise axis operator ($A^{\{(i)\}}$) of the corresponding noise channel (i) to thereby evaluate the performance of the control implementation;
    determining an optimised control sequence based on the filter function to reduce the susceptibility of the multi-qubit system to the noise channels, thereby reducing the effective interaction with the multi-qubit noise Hamiltonian; and
    applying the optimised control sequence to the multi-qubit system to control the quantum processor to thereby improve the performance of the control implementation.

2. The method of claim 1, wherein the multi-qubit noise axis operators are linear operators.

3. The method of claim 1, wherein the combination of the noise axis operators comprises a weighting of each noise axis operator by a random variable.

4. The method of claim 1, wherein the combination is a linear combination of the noise axis operators weighted by respective random variables.

5. The method of claim 1, wherein each of the multiple filter functions is based on a frequency transformation of a control Hamiltonian (U_c) applied to the noise axis operator.

6. The method of claim 5, wherein the control Hamiltonian represents an operation on multiple qubits.

7. The method of claim 6, wherein a gate set of the quantum processor comprises entangling operations and the control Hamiltonian includes the entangling operations between the multiple qubits.

8. The method of claim 5, wherein the control Hamiltonian (U_c) applied to the noise axis operator forms a toggling frame noise axis operator.

9. The method of claim 8, wherein the toggling frame noise axis operator represents control dynamics relative to the noise axis excluding stochastic content of the noise.

10. The method of claim 1, wherein the noise axis operator is in the Hilbert space of the multiple qubits.

11. The method of claim 1, wherein the noise axis operator is time varying.

12. The method of claim 1, wherein the dimensions of the noise axis operator are equal to the dimensions of a Hamiltonian of the multiple qubits.

13. The method of claim 1, wherein the noise axis operator is based on a non-Markovian error model.

14. The method of claim 1, wherein the noise axis operator is based on one or more measurements of an environment of the quantum processor.

15. The method of claim 1, wherein each filter function is based on a sum over dimensions of the noise axis operator of the frequency transformation.

16. The method of claim 1, wherein determining a control sequence based on the filter function is to reduce the noise influence on the operation on the multiple qubits.

17. The method of claim 1, further comprising: mapping operators for a multi-qubit system to an effective control Hamiltonian of reduced dimensionality, wherein each of the multiple filter functions is based on a frequency transformation of the effective control Hamiltonian (U_c) applied to the noise axis operator such that the optimized control sequence represents a multi-qubit control solution.

18. Software that, when executed by a computer, causes the computer to perform the method of claim 1.

19. A quantum processor comprising multiple qubits and a controller configured to:

model the noise by decomposing noise interactions described by a multi-qubit noise Hamiltonian into multiple contributory noise channels, each channel generating noise dynamics described by a unique noise-axis operator $A^{(i)}$, where (i) indexes the ith noise channel;

determine, for a given control implementation, the unique filter function for each noise channel representing susceptibility of the multi-qubit system to the associated noise dynamics, each of the multiple filter functions being based on a frequency transformation ($\mathcal{F}$) of the noise axis operator ($A^{(i)}$) of the corresponding noise channel (i) to thereby evaluate the performance of the control implementation;

determine an optimised control sequence based on the filter function to reduce the susceptibility of the multi-qubit system to the noise channels, thereby reducing the effective interaction with the multi-qubit noise Hamiltonian; and apply the optimised control sequence to the multi-qubit system to control the quantum processor to thereby improve the performance of the control implementation.

* * * * *

UNITED STATES PATENT AND TRADEMARK OFFICE
CERTIFICATE OF CORRECTION

PATENT NO. : 11,210,602 B2
APPLICATION NO. : 16/754684
DATED : December 28, 2021
INVENTOR(S) : Biercuk et al.

It is certified that error appears in the above-identified patent and that said Letters Patent is hereby corrected as shown below:

In the Specification

In Column 7, Line 51, delete "$U(\Sigma,0)|\psi(0)>$" and insert --$U(\tau,0)|\psi(0)>$-- therefor In Column 7, Line 59, equation 5, delete "$U(t,0) = \mathcal{T}\exp\left(-i\int_0^t H_c(t')dt'\right)$" and insert --$U_c(t,0) = \mathbf{T}\exp\left(-i\int_0^t H_c(t')dt'\right)$-- therefor In Column 8, Line 9, delete "A(t)" and insert --$\beta_i(t)$-- therefor In Column 10, Line 67, equation 35, delete "$\Phi_1=\Phi_1^\backslash$, $Tr(\Phi_1)=0$." and insert --$\Phi_1 = \Phi_1^\dagger, \quad \mathrm{Tr}(\Phi_1) = 0.$-- therefor In Column 11, Line 62, delete "$\mathcal{O}(|\Psi_1|^2)$," and insert --$O(|\Phi_1|^2)$-- therefor In Column 12, Line 5, equation 50, delete "$= 1 - \frac{1}{D}Tr(\langle\Phi_1\Phi_1^T\rangle)$" and insert --$= 1 - \frac{1}{D}\mathrm{Tr}\left(\langle\Phi_1\Phi_1^\dagger\rangle\right)$-- therefor In Column 12, Line 32, equation 57, delete "$\tilde{A}_0^{(i)} \equiv U_c^\backslash A^{(i)} U_c$." and insert --$\tilde{A}_0^{(i)} \equiv U_c^\dagger A^{(i)} U_c.$-- therefor Signed and Sealed this
Fourteenth Day of June, 2022

Katherine Kelly Vidal
*Director of the United States Patent and Trademark Office*

CERTIFICATE OF CORRECTION (continued)
U.S. Pat. No. 11,210,602 B2

In Column 13, Line 56, equation 72, delete "$(\tilde{A}_0^{(i)})^\dagger = (U_c^\dagger A^{(i)} U_c)^\dagger = (U_c)^\dagger (A^{(i)})^\dagger (U_c^\dagger)^\dagger = U_c^\dagger A^{(i)} U_c = \tilde{A}_0^{(i)}$" and insert --$\left(\tilde{A}_0^{(i)}\right)^\dagger = \left(U_c^\dagger A^{(i)} U_c\right)^\dagger = \left(U_c\right)^\dagger \left(A^{(i)}\right)^\dagger \left(U_c^\dagger\right)^\dagger = U_c^\dagger A^{(i)} U_c = \tilde{A}_0^{(i)}$-- therefor In Column 14, Line 26, equation 77, delete "$= \int_{-\infty}^{\infty} dt\, e^{+i\omega t} [\tilde{A}_0^{(i)}]_{jk}^*$" and insert --$= \int_{-\infty}^{\infty} dt\, e^{+i\omega t} \left[\tilde{A}_0^{(i)}\right]_{kj}^*$-- therefor In Column 17, Line 36, delete "Q(t)" and insert --$\Omega(t)$-- therefor In Column 18, Line 1, delete "Θ(t)" and insert --$\Theta_j(t)$-- therefor In Column 23, Line 36, after "operators", insert --$\hat{S}_i$--

In Column 27, Line 23, equation 410, delete "$|u>, A\beta u> \in \mathcal{H}_m, |v>, B|v> \in \mathcal{H}_p$" and insert --$|u>, A|u> \in H_m, |v>, B|v> \in H_p$-- therefor In Column 27, Lines 28-29, delete "$\mathcal{H}_{mp} = \mathcal{H} \otimes \mathcal{H}_p$" and insert --$H_{mp} = H_m \otimes H_p$-- therefor In Column 27, Line 49, equation 416, delete "$|ac> = |a> \otimes |b> \in \mathcal{H} \otimes \mathcal{H}\ |bd> = |b> |\,|d> \in \mathcal{H} \otimes \mathcal{H}$" and insert --$|ac> = |a> \otimes |b> \in H \otimes H\ |bd> = |b> \otimes |d> \in H \otimes H$-- therefor